United States Patent
Enomoto et al.

(10) Patent No.: US 8,820,541 B2
(45) Date of Patent: Sep. 2, 2014

(54) METHOD FOR PRODUCING CURABLE COMPOSITION FOR IMPRINTS

(75) Inventors: Yuichiro Enomoto, Haibara-gun (JP); Kunihiko Kodama, Haibara-gun (JP); Shinji Tarutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 322 days.

(21) Appl. No.: 13/239,062

(22) Filed: Sep. 21, 2011

(65) Prior Publication Data

US 2012/0076948 A1 Mar. 29, 2012

(30) Foreign Application Priority Data

Sep. 27, 2010 (JP) ................................. 2010-215795
Aug. 22, 2011 (JP) ................................. 2011-180798

(51) Int. Cl.
*B01D 35/02* (2006.01)
*C08F 14/18* (2006.01)
*C08F 12/00* (2006.01)

(52) U.S. Cl.
USPC .......... 210/493.1; 524/544; 524/588; 526/77; 522/172

(58) Field of Classification Search
USPC ......................................................... 526/77
See application file for complete search history.

(56) References Cited

U.S. PATENT DOCUMENTS

| | | | |
|---|---|---|---|
| 5,032,108 A | 7/1991 | Taniguchi et al. | |
| 5,169,965 A | 12/1992 | Fujiwa et al. | |
| 5,198,509 A | 3/1993 | Fujiwa et al. | |
| 5,259,926 A | 11/1993 | Kuwabara et al. | |
| 5,338,879 A | 8/1994 | Fujiwa et al. | |
| 5,378,736 A | 1/1995 | Fujiwa et al. | |
| 5,772,905 A | 6/1998 | Chou | |
| 5,956,216 A | 9/1999 | Chou | |
| 7,198,968 B2 | 4/2007 | Chae et al. | |
| 7,821,586 B2 | 10/2010 | Kim | |
| 2009/0286178 A1* | 11/2009 | Muroi et al. | 430/270.1 |
| 2010/0101493 A1 | 4/2010 | Hodge et al. | |
| 2010/0102471 A1 | 4/2010 | Truskett et al. | |
| 2010/0297551 A1 | 11/2010 | Teranishi | |
| 2011/0120937 A1* | 5/2011 | Ishizuka et al. | 210/493.1 |

FOREIGN PATENT DOCUMENTS

| | | | |
|---|---|---|---|
| EP | 1 361 066 A1 | 11/2003 | |
| EP | 1 574 901 A1 | 9/2005 | |
| JP | 11-100378 A | 4/1999 | |
| JP | 2906245 B2 | 6/1999 | |
| JP | 2926262 B2 | 7/1999 | |
| JP | 2004-240241 A | 8/2004 | |
| JP | 2004 326092 A | 11/2004 | |
| JP | 2005-197699 A | 7/2005 | |
| JP | 2005-301289 A | 10/2005 | |
| JP | 2008-019292 A | 1/2008 | |
| JP | 2008-105414 A | 5/2008 | |
| JP | 2009-073078 A | 4/2009 | |
| JP | 4323074 B2 | 9/2009 | |
| WO | WO 2010064726 A2 * | 6/2010 | ............... C08F 2/48 |
| WO | 2010150740 A1 | 12/2010 | |

OTHER PUBLICATIONS

Stephen Y. Chou, et al., "Imprint of sub-25 nm vias and trenches in polymers", Appl. Phys. Lett., Nov. 20, 1995, pp. 3114-3116, vol. 67, No. 21.
M. Colburn, et al., "Step and Flash Imprint Lithography: A New Approach to High-Resolution Patterning", Proc. SPIE, Mar. 1999, p. 379-389, vol. 3676.
Lecture of Experimental Chemistry 20, 4th Ed., Organic Synthesis II, 1992, pp. 213-223, Maruzen.
Alfred Hassner, ed., "Small Ring Heterocycles Part 3, Oxiranes", The Chemistry of Heterocyclic Compounds, 1985, John Wiley and Sons, an Interscience Publication, New York.
Yoshimura, Adhesive, 1985, pp. 32-39, vol. 29, No. 12.
Yoshimura, Adhesive, 1986, pp. 42-47, vol. 30, No. 5.
Yoshimura, Adhesive, 1986, pp. 42-47, vol. 30, No. 7.
Stephen C. Lapin, "Vinyl Ether Functionalized Urethane Oligomers: An Alternative to Acrylate Based Systems", Polymer Paint Colour Journal, May 17, 1989, pp. 321-328, vol. 179, No. 4237.
European Search Report dated Feb. 1, 2012 in EP Appln. No. 11181756.5.

* cited by examiner

*Primary Examiner* — Vu A Nguyen
(74) *Attorney, Agent, or Firm* — Sughrue Mion, PLLC

(57) ABSTRACT

A method for producing a curable composition for imprints includes the step of passing a curable composition containing a polymerizable monomer (A) and a polymerization initiator (B) through a filter having an effective filter area of 200 $cm^2$ or more at least one time. The method suppresses pattern-peeling when peeling the mold employed in forming a pattern using the curable composition for imprints, and thus provides excellent patternability.

10 Claims, No Drawings

METHOD FOR PRODUCING CURABLE COMPOSITION FOR IMPRINTS

CROSS-REFERENCE TO RELATED APPLICATIONS

The present application claims the benefit of priority from Japanese Patent Application No. 215795/2010, filed on Sep. 27, 2010, and Japanese Patent Application No. 180798/2011, filed on Aug. 22, 2011, the contents of which are herein incorporated by reference in their entirety.

TECHNICAL FILED

The present invention relates to a method for producing a curable composition for imprints, a patterning method, and a device for producing a curable composition for imprints.

More precisely, the invention relates to a method for producing a curable composition for patterning through photo-irradiation to give imprints, which is used in producing magnetic recording media such as semiconductor integrated circuits, flat screens, micro electromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, see S. Chou, et al., Appl. Phys. Lett. Vol. 67, 3114 (1995)), and the other is a photonanoimprint method using a photo-curable composition (for example, see M. Colbun, et al., Proc. SPIE, Vol. 3676, 379 (1999)). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose a nanoimprint method of forming nanopatterns inexpensively.

On the other hand, in the photonanoimprint method where a curable composition for photonanoimprints is photo-cured by photo-irradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As one example of nanoimprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, nanoimprint lithography (photonanoimprint method) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of nanoimprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, may cause erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of nanoimprint technology is proposed. The application also requires micropatternability on a level of a few tens nm and high-level etching resistance of the micropattern functioning as a mask in substrate processing.

Next described is an application example of nanoimprint technology to flat displays such as liquid-crystal displays (LCD) and plasma display panels (PDP).

With the recent tendency toward large-sized LCD substrates and PDP substrates for high-definition microprocessing thereon, photonanoimprint lithography has become specifically noted these days as an inexpensive lithography technology capable of being substituted for conventional photolithography for use in production of thin-film transistors (TFT) and electrode plates. Accordingly, it has become necessary to develop a photo-curable resist capable of being substituted for the etching photoresist for use in conventional photolithography.

Further, for the structural members for LCD and others, application of photonanoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photo-curable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied onto, and a pattern having a size of from 10 μm or 20 μm or so is formed through photolithography, and this is further thermally cured through past-baking to form the intended spacer.

Also an anti-reflective structure composed of a micro-pattern having a 50 to 300-nm pitch has been attracting public attention. Nanoimprint is useful also for forming the pattern. This sort of anti-reflective structure may be represented by a micro-dot pattern which is generally called "moth-eye", and is effective for improving anti-reflective performance of display surface, efficiency of solar energy utilization of solar cell, and light extraction efficiency of LED and organic EL device. In most cases of these applications, the thus-formed pattern remains in the final form of products, and is disposed in the outermost portion of the product, so that the anti-reflective structure is required to have excellent performance mainly regarding durability and strength of film, such as heat resistance, light resistance, solvent resistance, scratch resistance, good mechanical characteristics durable against external pressure, and hardness.

Further, nanoimprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in nanoimprint technology, which is therefore specifically noted as a technology capable of forming micropatterns inexpensively.

SUMMARY

There was a problem in that a part of a pattern is peeled at the process of peeling the mold in forming the pattern using a curable composition for imprints. In addition, there was a problem that discharging-failure due to clogging is caused when the curable composition is applied to a substrate by a ink-jet method, and a problem that particles occur in liquid of the composition when the composition is stored for long hours. The object of the present invention is to solve the problems and to provide a curable composition for imprints of which mold-peeling is suppressed.

Under the above problems, the inventors investigated patternability of a curable composition for imprints, and found that pattern-peeling in peeling the mold of the pattern formation is suppressed by passing the curable composition for imprints through a filter having an effective filter area of 200 $cm^2$ or more.

The reason is not clear, but is expected as described below.

When a curable composition for imprints contains a polymer impurity not having a polymerizable group as a foreign substance, curing reaction thereof does not proceeds in the area of the impurity in a film made of a curable composition or a drop of a curable composition, and therefore, the polymer impurity may cause reduction of pattern strength and adhesiveness of pattern to the substrate.

When a curable composition for imprints is filtered through a filter having a small effective filter area at a small pressure, the pressure applied to the filter varies with variation of pressure applied to the container, or variation of the amount of the composition in the container, so that the flow rate varies and a part of the foreign substance passes through the filter. When the flow rate is increased by increasing the effective filter area, the foreign substance is prevented from passing through the filter, so that the pattern-peeling is suppressed.

When foreign substance which passes through the filter is present in the liquid of the curable composition for imprints, discharging-failure due to the clogging of the composition is caused in applying the curable composition onto a substrate according to ink-jet method, or a nucleus which becomes particle occurs. However, it was found that those failures can be suppressed by using the method of the present invention as well as the above.

Specifically, the above problems can be solved by the following means.

(1) A method for producing a curable composition for imprints, which comprises passing a curable composition comprising a polymerizable monomer (A) and a polymerizable initiator (B) through a filter having an effective filter area of 200 $cm^2$ or more at least one time.

(2) A method for producing a curable composition for imprints, which comprises passing a curable composition comprising a polymerizable monomer (A) and a polymerizable initiator (B) through a filter having an effective filter area of 200 cm² or more at least twice.

(3) The method for producing a curable composition for imprints according to (2), wherein the filter which the composition is passed through later has a smaller pore size than a pore size of the filter in the former filtration.

(4) The method for producing a curable composition for imprints according to any one of (1) to (3), wherein the pressure applied to the composition at the filtration is 0.5 MPa or less.

(5) The method for producing a curable composition for imprints according to any one of (1) to (4), wherein at least one filter has a pore size of 0.1 or less.

(6) The method for producing a curable composition for imprints according to any one of (2) to (4), wherein all the filters each have a pore size of 0.1 µm or less.

(7) The method for producing a curable composition for imprints according to any one of (1) to (6), wherein at least one of the filters is a fluorine resin filter or a polyethylene filter.

(8) The method for producing a curable composition for imprints according to any one of (1) to (7), wherein at least one of the filters is a filter cartridge in a pleat state fabricated from a membrane filter.

(9) The method for producing a curable composition for imprints according to any one of (1) to (8), wherein the polymerizable monomer (A) is a polymerizable monomer having an aromatic structure and/or a cyclic hydrocarbon structure.

(10) The method for producing a curable composition for imprints according to anyone of (1) to (9), wherein the curable composition comprises a polymerizable monomer having at least one of fluorine atom and silicon atom.

(11) The method for producing a curable composition for imprints according to any one of (1) to (10), wherein the curable composition is substantially free from a solvent.

(12) The method for producing a curable composition for imprints according to any one of (1) to (11), wherein the curable composition for imprints has a viscosity of 5 to 50 mPa·s at 25° C.

(13) A patterning method, comprising preparing a curable composition for imprints according to the method for producing a curable composition according to any one of (1) to (12), applying the curable composition onto a substrate, pressing a mold against a surface of the curable composition for imprints, and irradiating the curable composition for imprints with light.

(14) The patterning method according to (13), wherein the curable composition is applied by an ink-jet method or spin coat method.

(15) A curable composition for imprints obtainable by the method for producing a curable composition according to any one of (1) to (12).

(16) A device for producing a curable composition for imprints, having a filter having an effective filter area of 200 cm² or more.

(17) The device for producing a curable composition for imprints according to (16), which comprises a step for passing a curable composition for imprints comprising (A) polymerizable monomer and (B) polymerization initiator through a filter having an effective filter area of 200 cm² or more at least one time.

The production method of the invention makes it possible to form a good pattern. In particular, the production method of the invention makes it possible to enhance patternability in forming super micropattern.

DETAILED DESCRIPTION OF INVENTION

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. In the invention, monomer is differentiated from oligomer and polymer, and the monomer indicates a compound having a weight-average molecular weight of at most 1,000. In this description, "functional group" means a group participating in polymerization.

"Imprint" referred to in the invention is meant to indicate pattern transfer in a size of from 1 nm to 10 mm and preferably meant to indicate pattern transfer in a size of from about 10 nm to 100 µm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

The method for producing a curable composition for imprints is characterized by comprising passing a curable composition comprising a polymerizable monomer and a polymerizable initiator (B) through a filter having an effective filter area of 200 cm² or more at least one time. The effective filter area of the present invention means an area of a part which is in contact with a liquid to be filtered and in which the particles which do not pass through a filter accumulate. The effective filter are is generally a surface area of the filter.

In the method of the present invention, the curable composition is preferably passed through the filters at least twice, more preferably 2 to 10 times. When the composition is passed through the filters at least twice, the filters may be the same or different to each other. By passing the composition through the filter at least twice, foreign substances are effectively removed.

The method for passing the curable composition for imprints through filters over multiple times is not specifically limited, but preferred is a method for circulating the composition in a device having a filter, a method for passing the composition at least one time through each of multiple filters which are placed in series, a method for re-filtering the composition after a filtration using the same or different filter from the filter of the former filtration, and a method for combining thereof.

The effective filtration area is preferably 300 cm² or more, more preferably 500 cm² or more, further more preferably 1000 cm² or more.

When the composition is passed through the filters at least twice, the filter which the composition is passed through later preferably has a smaller pore size than a pore size of the filter in the former filtration. Such a constitution tends to effectively suppress the pattern-peeling.

The pressure applied to the composition in passing the composition through the filter may vary depending on materials of the filter, the filtering device, chemical structure of the curable composition, and is preferably 0.5 MPa. Such a pressure range effectively prevents from passing the particles due to impurity through the filter.

The pressure applied to the composition is preferably 0.05 MPa to 0.3 MPa, more preferably 0.05 MPa to 0.1 MPa. In the invention, an average flow rate of the curable composition for imprints is preferably 0.1 L per minute, more preferably 0.1 L per minute to 3.0 L per minute.

At least one filter of the filters for use in the present invention preferably has a pore size of 0.1 μm or more, and all of the filters each have a pore size of 0.1 μm or more. The pore size is preferably 0.05 μm or less, more preferably 0.005 to 0.05 μm. By passing the curable composition through a filter having the above pore size, microparticles having a submicron size and foreign substances may be removed, and discharging-failure due to the clogging in applying the curable composition onto a substrate by an ink-jet method may be suppressed.

Materials of the filter for use in the present invention is not specifically limited, but at least one kind of the materials is preferably a polypropylene resin, a fluorine resin, a polyethylene resin, or a nylon resin. Especially, at least one kind of the materials is a fluorine resin or a polyethylene resin from the viewpoints of the removal of the foreign substances and the stability over time of the filter.

The filter for use in the invention is preferably a filter cartridge in a pleat state fabricated from a membrane filter. Such a filter cartridge in a pleat state fabricated from a membrane filter has an advantage of large effective filter area.

The device for manufacturing a curable composition for imprints of the present invention is not limited as long as the device contains the above filter. Concerning the other parts in the device, known techniques may be adapted. Specifically, the techniques disclosed in Japanese Patent No. 4323074 may be applied.

The curable composition for imprints of the present invention is characterized by comprising a polymerizable monomer (A) and a polymerizable initiator (B). The polymerizable monomer (A) is exemplified by a monomer having a polymerizable group, an oligomer having a polymerizable group, and a mixture thereof.

Species of the polymerizable monomer adoptable to the curable composition for imprints used for the present invention is not specifically limited, without departing from the gist of the present invention, and may be exemplified by a polymerizable unsaturated monomer having at least one ethylenic unsaturated bond-containing group; epoxy compound; oxetane compound; vinyl ether compound; styrene derivative; fluorine atom-containing compound; and propenyl ether or butenyl ether.

The polymerizable unsaturated monomer having at least one ethylenic unsaturated bond-having group(s) is described below.

The polymerizable unsaturated monomer having one ethylenic unsaturated bond-having group includes concretely methyl(meth)acrylate, ethyl(meth)acrylate, butyl(meth)acrylate, N-vinyl pyrrolidinone, 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl(meth)acrylate, 2-hydroxypropyl (meth)acrylate, 4-hydroxybutyl (meth)acrylate, acrylic acid dimer, benzyl (meth)acrylate, 1- or 2-naphthyl(meth)acrylate, butoxyethyl (meth)acrylate, cetyl (meth)acrylate, ethyleneoxide-modified (hereinafter this may be referred to as "EO") cresol (meth)acrylate, dipropylene glycol (meth)acrylate, ethoxylated phenyl (meth)acrylate, isoamyl (meth)acrylate, cyclopentanyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth)acrylate, methoxytriethylene glycol (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth)acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tribromophenyl (meth)acrylate, EO-modified tribromophenyl (meth)acrylate, tridodecyl (meth)acrylate, p-isopropenylphenol, styrene, N-vinyl pyrrolidone, N-vinyl caprolactam.

Of the monofunctional polymerizable monomers having ethylenic unsaturated bond(s), monofunctional (meth)acrylate compound is preferably used in the present invention, from the viewpoint of photo-curability. The monofunctional (meth)acrylate compound may be exemplified by those previously exemplified as the monofunctional polymerizable monomers having ethylenic unsaturated bond(s).

Of those, especially preferred for use in the present invention are a mono-functional (meth)acrylate having an aromatic structure and/or alicyclic hydrocarbon structure in view of improving dry etching resistance, more preferably a monofunctional (meth)acrylate having an aromatic structure. Specific examples thereof include benzyl (meth)acrylate, benzyl (meth)acrylate having a substituent on the benzene ring, wherein examples of preferable substituent include an alkyl group having 1 to 6 carbon atoms, an alkoxy group having 1 to 6 carbon atoms, and cyano group, 1- or 2-naphthylmethyl (meth)acrylate, dicyclopentanyl (meth)acrylate, dicyclopentanyloxyethyl (meth)acrylate, isobornyl (meth)acrylate, adamantyl (meth)acrylate. More preferred examples thereof include benzyl (meth)acrylate having a substituent on the benzene ring, and monofunctional (meth)acrylate compound having a naphthalene structure. Particularly preferred examples thereof include 1- or 2-naphthyl (meth)acrylate and 1- or 2-naphtylmethyl (meth)acrylate.

As the other polymerizable monomer, also preferred is a poly-functional polymerizable unsaturated monomer having two ethylenic unsaturated bond-containing groups.

Preferred examples of the di-functional polymerizable unsaturated monomer having two ethylenic unsaturated bond-containing groups for use in the present invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, poly (ethylene glycol-tetramethylene glycol) di(meth)acrylate, poly(propylene glycol-tetramethylene glycol) di(meth)acrylate, polyester (di) acrylate, polyethylene glycol di(meth) acrylate, polypropylene glycol di(meth)acrylate, ECH-modified propylene glycol di(meth)acrylate, silicone di(meth) acrylate, triethylene glycol di(meth)acrylate, tetraethylene glycol di(meth)acrylate, dimethyloltricyclodecane di(meth) acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea, o-, m-, or p-Xylylenedi(meth)acrylate, 1,3-adamantane diacrylate, norbornane dimethanol diacrylate.

Of those, especially preferred for use in the present invention are neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, o-, m-, or p-, benzene di(meth)acrylate, o-, m-, or p-xylene di(meth)aclyate, etc.

Examples of the poly-functional polymerizable unsaturated monomer having at least three ethylenic unsaturated bond-having groups include ECH-modified glycerol tri (meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl)isocyanurate, dipentaerythritol hexa(meth)acrylate, caprolactone-modified dipentaerythritol hexa(meth)acrylate, dipentaerythritol hydroxy-penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylate, etc.

Of those, especially preferred for use in the present invention are EO-modified glycerol tri(meth)acrylate, PO-modified glycerol tri(meth)acrylate, trimethylolpropane tri(meth) acrylate, EO-modified trimethylolpropane tri(meth)acrylate, PO-modified trimethylolpropane tri(meth)acrylate, dipentaerythritol hexa(meth)acrylate, pentaerythritol ethoxy-tetra (meth)acrylate, pentaerythritol tetra(meth)acrylate, etc.

Of the multi-functional polymerizable unsaturated monomers having two or more ethylenic unsaturated bonds, multi-functional (meth)acrylate is preferably used from the viewpoint of photo-curability. The multi-functional (meth) acrylate herein is a general term for the bifunctional (meth) acrylate and tri-functional or higher valency of (meth) acrylates. Specific examples of multi-functional (meth) acrylate includes those found among the above-exemplified multi-functional polymerizable unsaturated monomer having two ethylenic unsaturated bonds, and those found among the above-exemplified multi-functional polymerizable unsaturated monomers having three or more ethylenic unsaturated bonds.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

The oxirane ring-having compounds preferred for use in the present invention are exemplified by those disclosed at paragraph 0053 of JP-A 2009-73078.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are exemplified by those disclosed at paragraph 0055 of JP-A 2009-73078. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262. As the polymerizable monomer for use in the present invention, vinyl ether compounds also may be in the composition.

Any known vinyl ether compounds are usable and are exemplified by those disclosed at paragraph 0057 of JP-A 2009-73078.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, beta-methylstyrene, p-methyl-beta-methylstyrene, alpha-methylstyrene, p-methoxy-beta-methylstyrene, p-hydroxystyrene, etc.

The curable composition for imprints in the present invention may further contain a polymerizable oligomer and/or a polymerizable polymer which has a molecular weight higher than that the above polymerizable monomer has, in view of improving dry etching resistance, imprint suitability and curability. The polymerizable oligomer includes various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, further more preferably 0 to 10% by mass, and most preferably 2% by mass or less. Pattern formability may be improved by adjusting the content of polymer component having a molecular weight of 2,000 or larger to 30% by mass, with respect to the portion of the curable composition for imprints of the present invention excluding the solvent.

The curable composition of the present invention preferably comprises a polymerizable monomer having at least either one of fluorine atom and silicon atom. The polymerizable monomer having at least either one of fluorine atom and silicon atom is understood as a compound having at least one group having fluorine atom, silicon atom, or both of fluorine atom and silicon atom, and at least one polymerizable functional group. The polymerizable functional group is preferably methacryloyl group, or epoxy group.

While the content of the polymerizable monomer, having at least either one of fluorine atom and silicon atom, in the curable composition for imprints of the present invention is not specifically restricted, it is preferably 0.1 to 20% by mass of the total polymerizable monomer, preferably 0.2 to 15% by mass, more preferably 0.5 to 10% by mass, and particularly preferably 0.5 to 5% by mass, in view of improving curability and reducing viscosity of composition.

(1) Polymerizable Compound Having Fluorine Atom

The fluorine atom-containing group owned by the fluorine atom-containing polymerizable monomer is preferably selected from fluoroalkyl group and fluoroalkyl ether group.

The fluoroalkyl group is preferably a fluoroalkyl group having carbon atoms of 2 to 20, and a fluoroalkyl group having carbon atoms of 4 to 8.

Preferable examples of fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

The polymerizable compound having fluorine atom is preferably a polymerizable compound having trifluoromethyl group. By virtue of the trifluoromethyl group structure, the effects of the present invention may be expressed only with a small amount of addition (10% by mass or less, for example), so that compatibility with other components may be improved, line edge roughness after dry etching may be improved, and formability of repetitive pattern may be improved.

The fluoroalkyl ether group preferably has a trifluoromethyl group, similarly to the fluoroalkyl group, which may be exemplified by perfluoroethylenoxy group and perfluoropropyleneoxy group. Preferable examples are those having a fluoroalkyl ether unit having a trifluoromethyl group such as —(CF$_3$)CF$_2$O—, and/or those having a trifluoromethyl group at the terminal of the fluoroalkyl ether group.

The total number of fluorine atoms per one molecule, owned by the polymerizable monomer, having at least either one of fluorine atom and silicon atom, is preferably 6 to 60, more preferably 9 to 40, even more preferably 12 to 40, still more preferably 12 to 20.

The polymerizable monomer having at least either one of fluorine atom has a fluorine content, defined below, of 20 to 60%, more preferably 30 to 60%, and still more preferably 35 to 60%. By adjusting the fluorine content in the appropriate range, the curable composition may be improved in compatibility with other components, less causative of fouling on mold, improved in the line edge roughness after dry etching, and improved in the formability of repetitive pattern transfer.

In this patent specification, the fluorine content is given by the equation below:

Fluorine content=[{(Number of fluorine atoms in polymerizable compound)×(atomic weight of fluorine atom)}/(molecular weight of polymerizable compound)]×100

As a preferable example of the fluorine atom-containing of polymerizable monomer, having at least either one of fluorine atom and silicon atom, a compound having a partial structure represented by formula (I) below may be exemplified. By adopting a compound having such partial structure, the curable composition having an excellent formability of pattern, even after repetitive pattern transfer, may be obtained, and stability over time of the composition may be improved.

Formula (I)

In formula (I), n represents an integer of 1 to 8, and preferably 4 to 6.

One preferable example of the polymerizable monomer having fluorine atom is exemplified by a compound having a partial structure represented by the following formula (II). Of course, the polymerizable monomer having fluorine atom may have both of the partial structure represented by the following formula (I) and the partial structure represented by the following formula (II).

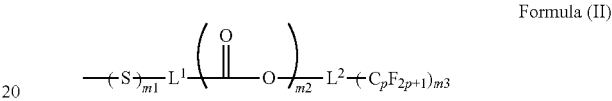

Formula (II)

(In the formula (II), $L^1$ represents a single bond, or an alkylene group having carbon atoms of 1 to 8, $L^2$ represents an alkylene group having carbon atoms of 1 to 8, m1 and m2 each represent 0 or 1, wherein at least one of m1 and m2 is 1, m2 is an integer of 1 to 3, p is an integer of 1 to 8, and when m3 is 2 or more, each of —$C_pF_{2p+1}$ may be the same or different to each other.)

The above $L^1$ and $L^2$ each preferably are an alkylene group having carbon atoms of 1 to 4. The alkylene group may have a substituent without diverting the scope of the gist of the present invention. The above m3 is preferably 1 or 2. The above p is preferably an integer of 4 to 6.

As the fluorine atom-containing polymerizable monomer, exemplified are fluorine atom-containing monofunctional polymerizable monomer such as trifluoroethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, and hexafluoropropyl (meth)acrylate. Also multi-functional polymerizable monomer having two or more polymerizable functional groups, such as those having di(meth)acrylate structure having fluoroalkylene group, exemplified by 2,2,3,3,4,4-hexafluoropentane di(meth)acrylate and 2,2,3,3,4,4,5,5-octafluorohexane di(meth)acrylate, may be preferable examples of the fluorine atom-containing polymerizable monomer.

Also compounds having two or more fluorine-containing groups, such as fluoroalkyl group and fluoroalkyl ether group, in one molecule may preferably be used. More preferably, the compounds are such as those having at least two fluorine-containing groups selected from fluoroalkyl group and fluoroalkyl ether group, where at least two of the fluorine-containing group are brought apart while placing a $C_2$ or longer linking group in between.

The fluoroalkyl group preferably has two or more carbon atoms, and more preferably four or more carbon atoms. While the upper limit value of the number of carbon atoms is not specifically limited, it is preferably 20 or smaller, more preferably 8 or smaller, and still more preferably 6 or smaller. Fluoroalkyl group having 4 to 6 carbon atoms is most preferable. At least two of the fluoroalkyl groups preferably have a trifluoromethyl group structure. By containing a plurality of trifluoromethyl group structures, the curable composition exhibits the effects of the present invention even with a small amount of addition (for example, 10% by mass or less), so that compatibility with other components may be improved, and line edge roughness after dry etching may be improved.

From a similar point of view, also compounds having three or more trifluoromethyl groups in the polymerizable monomer (A) are preferable. More preferably, the compounds are those having 3 to 9, and more preferably 4 to 6, trifluoromethyl group structures. Preferable examples, of the compounds having three or more trifluoromethyl groups include those having a branched fluoroalkyl group which has two or more trifluoromethyl groups bound to a single fluorine-containing group, such as —CH(CF$_3$)$_2$, —C(CF$_3$)$_3$, and —CCH$_3$(CF$_3$)$_2$CH$_3$.

The fluoroalkyl ether group is preferably those having a trifluoromethyl group, exemplified by those having perfluoroethylenoxy group or perfluoropropyleneoxy group. Those having fluoroalkyl ether unit having a trifluoromethyl group such as —(CF(CF$_3$)CF$_2$O)—, and/or those having a trifluoromethyl group at the terminal of fluoroalkyl ether group, are preferable.

At least two of the fluorine-containing groups owned by the polymerizable monomer (A) may preferably be brought apart while placing a C$_2$ or longer linking group in between. In other words, for the case where the polymerizable monomer (A) has two or more fluorine-containing groups, two such fluorine-containing group are brought apart while placing a C$_2$ or longer linking group in between. For the case where the polymerizable monomer (A) has three or more fluorine-containing groups, at least two of them are brought apart while placing a C$_2$ or longer linking group in between, while allowing arbitrary mode of binding for the residual fluorine-containing groups. The C$_2$ or longer linking group herein is a linking group having at least two carbon atoms not substituted by fluorine atoms.

Functional groups possibly contained in the C$_2$ or longer linking group include groups having at least one of alkylene group, ester group, sulfide group, arylene group, amide group and urethane group, wherein at least ester group and/or sulfide group may preferably be contained. The C$_2$ or longer linking group is preferably selected from alkylene group, ester group, sulfide group, arylene group, amide group, urethane group and combinations of these groups.

These groups may have a substitutive group, without departing from the spirit of the present invention.

A preferable example of the polymerizable monomer (A) may be exemplified by a compound represented by formula (A1) below.

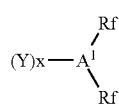

(A1)

In formula (A1), Rf represents a functional group having a fluorine-containing group selected from fluoroalkyl group and fluoroalkyl ether group, and A$^1$ represents a linking group. Y represents a polymerizable functional group, and preferably represents a (meth)acryl ester group, epoxy group, or vinyl ether group. x represents an integer of 1 to 4, and preferably represents 1 or 2. If x is 2 or larger, the individual (Y)s may be same with, or different from each other.

A$^1$ preferably represents a linking group having an alkylene group and/or arylene group, and may additionally have a linking group which contains a hetero atom. The linking group having a hetero atom may be exemplified by —O—, —C(=O)O—, —S—, —C(=O)—, and —NH—. While the groups may have a substituent without departing from the spirit of the present invention, no substitution is more preferable. A$^1$ is preferably a C$_{2-50}$ linking group, and more preferably C$_{4-15}$ linking group.

Preferable examples of the polymerizable monomer (A) may be

The polymerizable monomer (A) is preferably a polymerizable monomer represented by formula (III) below.

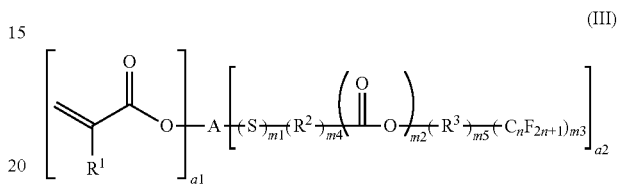

(III)

(In formula (III), R$^1$ represents a hydrogen atom, alkyl group, halogen atom or cyano group, A represents an (a1+a2)-valent linking group, and a1 represents an integer of 1 to 6. a2 represents an integer of 2 to 6, and each of R$^2$ and R$^3$ independently represents a C$_{1-8}$ alkylene group. Each of m1 and m2 independently represents 0 or 1, and at least either one of m1 and m2 is 1. m3 represents an integer of 1 to 3. Each of m4 and m5 independently represents 0 or 1, at least either one of m4 and m5 is 1, and m4 represents 1 if both of m1 and m2 are 1. n represents an integer of 1 to 8.)

R$^1$ represents a hydrogen atom, alkyl group, halogen atom or cyano group, preferably hydrogen atom or alkyl group, more preferably hydrogen atom or methyl group, and still more preferably hydrogen atom.

"A" represents an (a1+a2)-valent linking group, preferably a linking group which has an alkylene group and/or arylene group, and may additionally have a hetero atom-containing linking group. The hetero atom-containing linking group may be exemplified by —O—, —C(=O)O—, —S—, —C(=O)—, and —NH—. These groups may have substituents without departing from the scope of the present invention, but more preferably have no substituents. "A" is preferably C$_{2-50}$ group, and more preferably C$_{4-15}$ group.

R$^2$, R$^3$, m1, m2, m3 and n are similarly defined as those in formula (II), also with the same preferable ranges.

a1 represents an integer of 1 to 6, preferably 1 to 3, and more preferably 1 or 2.

a2 represents an integer of 2 to 6, preferably 2 or 3, and more preferably 2.

If a1 is 2, the individual (A)s may be same with, or different from each other.

If a2 is 2 or larger, each of R$^2$, R$^3$, m1, m2, m3, m4, m5 and n may be same with, or different from each other.

Molecular weight of the polymerizable monomer (A) used in the present invention is preferably 500 to 2,000, preferably 600 to 1,500, and more preferably 600 to 1,200.

Specific examples of the polymerizable monomer (A) used for the curable composition for imprints of the present invention will be given below, without restricting the present invention. R$^1$ in the formulae below represents any of hydrogen atom, alkyl group, halogen atom and cyano group.

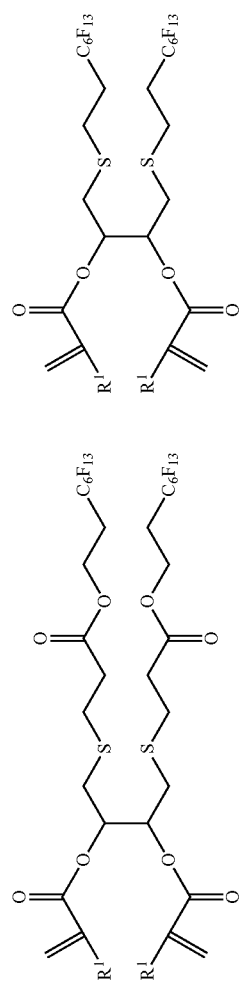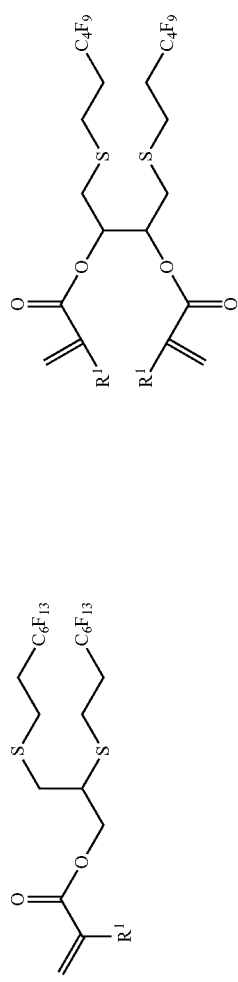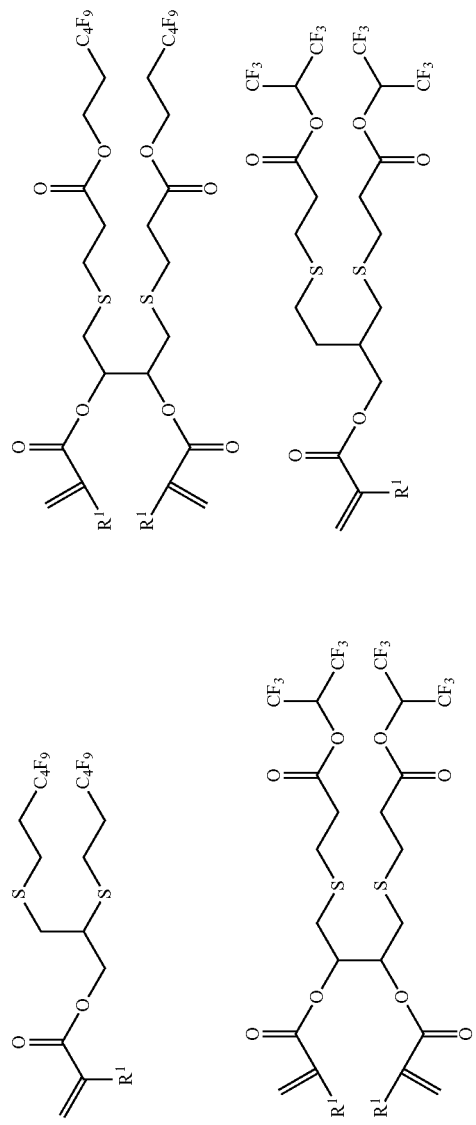

-continued
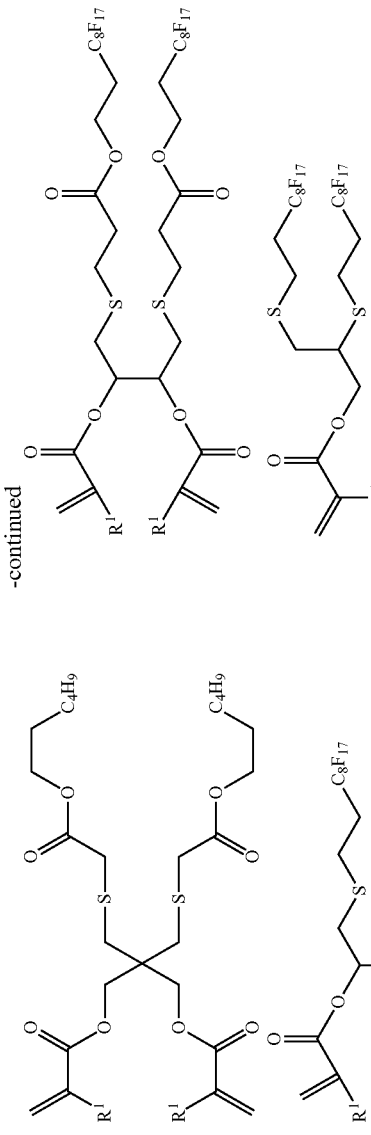
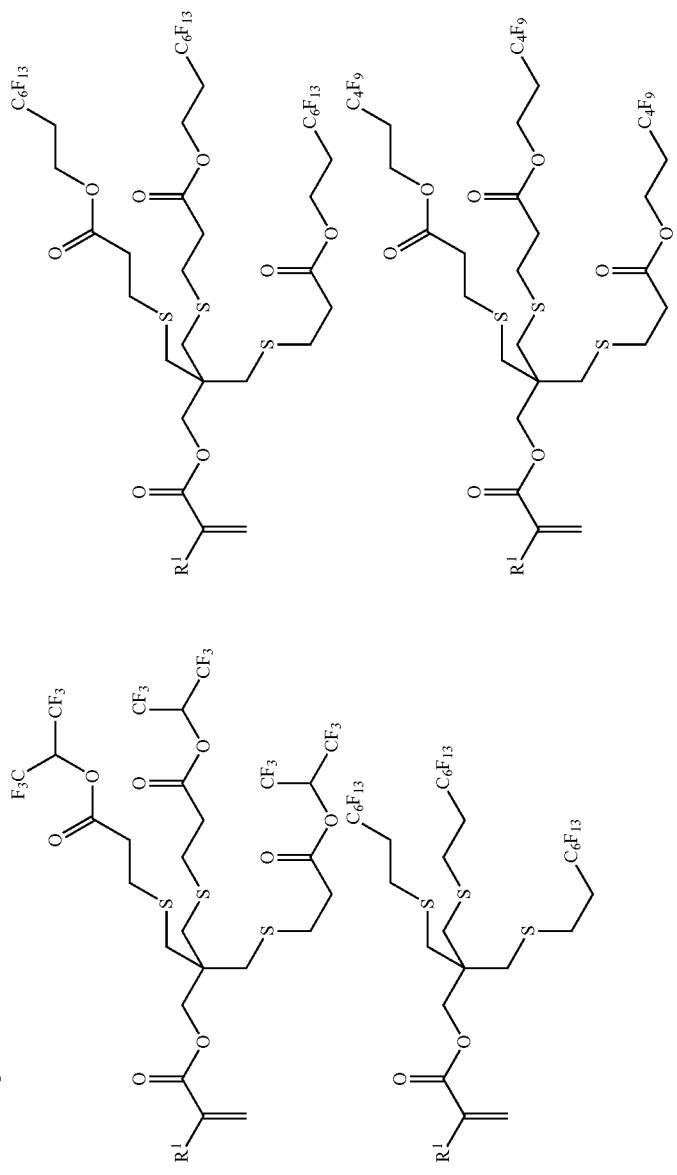

-continued
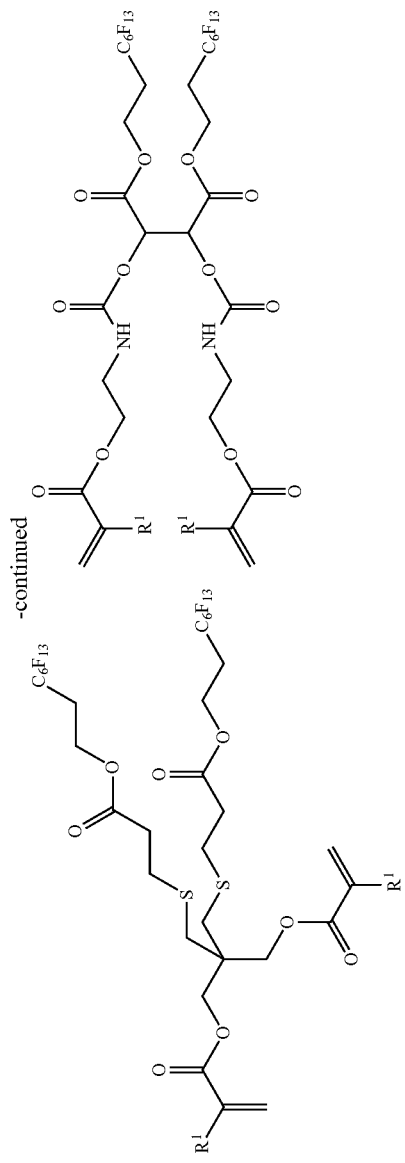
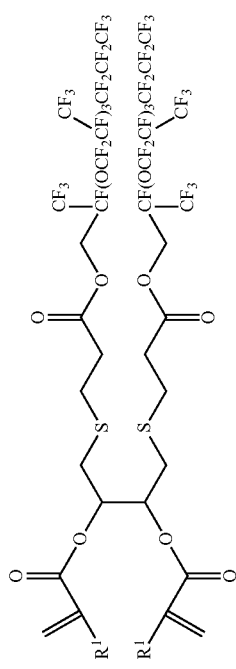
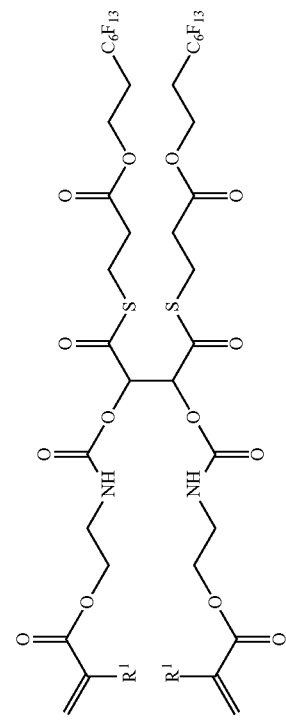

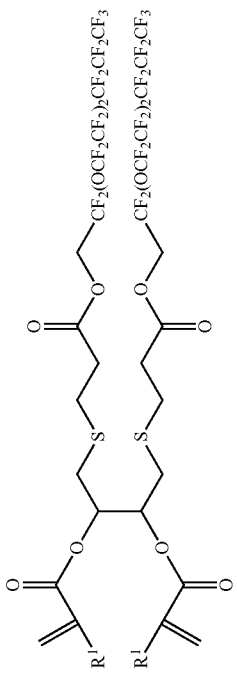
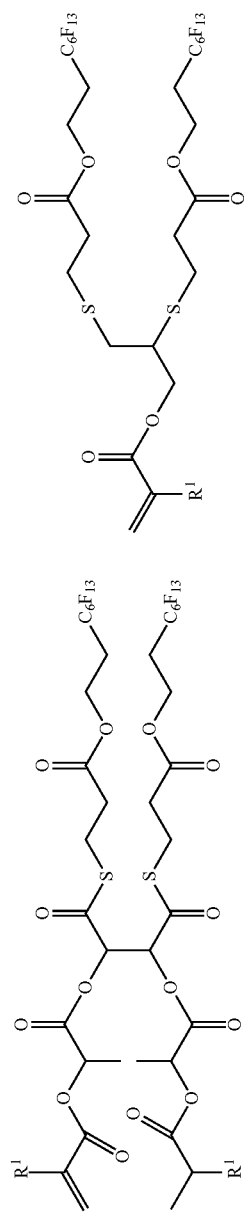
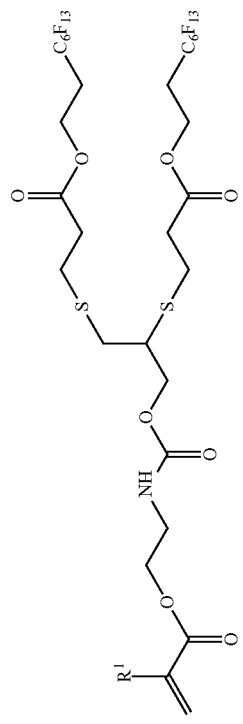

(2) Polymerizable Monomer Having Silicone Atom

A silicone-containing functional group that the above polymerizable monomer having silicon atom has is exemplified by a trialkyl silyl group, a trialkylsilyl group, a chain-like siloxane structure, a circular siloxane structure, and a cage-type siloxane structure. From the viewpoints of compatibility and mold releasability, it is preferable a trimethylsilyl group, or a functional group having a dimethylsiloxane structure.

The silicon atom-containing polymerizable monomer may be exemplified by 3-tris(trimethylsilyloxy)silylpropyl (meth) acrylate, trimethylsilylethyl (meth)acrylate, (meth)acryloyl-methylbis(trimethylsiloxy)methyl silane, (meth)acryloxym-ethyl tris(trimethylsiloxy)silane, 3-(meth) acryloxypropyl bis (trimethylsiloxy)methyl silane, a polysiloxane having a (meth)acryloyl group at a terminal or at a side chain which is exemplified by X-22-164 series, X-22-174DX, X-22-2426 and X-22-2475 manufactured by Shin-Etsu Chemical Co., Ltd.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-nor-bornene, 1,4-di(1-butenoxy)butane, 1,10-di(1-butenoxy)de-cane, 1,4-di(1-butenoxymethyl)cyclohexane, diethylene glycol di(1-butenyl)ether, 1,2,3-tri(1-butenoxy)propane, propenyl ether propylene carbonate, etc.

As the polymerizable monomer for use in the present invention, a polymerizable monomer represented by the following formula;

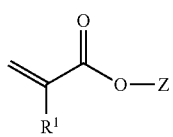

(I)

(In the formula, Z is a group having an aromatic group and having a molecular weight of 100 or more, $R^1$ is hydrogen atom, an alkyl group, or a halogen group. When the polymerizable monomer is liquid at 25° C., the viscosity thereof at 25° C. is 500 mPa·s or less.)

$R^1$ is preferably hydrogen atom, or an alkyl group, more preferably hydrogen atom, or a methyl group, further more preferably hydrogen atom from the viewpoint of the curability of the composition. Examples of the halogen atom include fluorine atom, chlorine atom, bromine atom, and iodine atom, and preferred is fluorine atom.

Z is an aralkyl group which may have a substituent, an aryl group which may have a substituent, or a group in which those groups are bonded to each other via a linking group. The linking group may include a hetero atom. The linking group is preferably —$CH_2$—, —O—, —C(=O)—S—, or a combination thereof.

The aromatic group contained in Z is preferably a phenyl group or a naphthyl group, and the aromatic group more preferably contains only a phenyl group as an aromatic group. Compared with polycyclic aromatic groups and hetero aromatic groups, a compound containing only a phenyl group as an aromatic group has lower viscosity and better patternability, and can control failure of particle. The molecular weight of Z is preferably 100 to 300, more preferably 120 to 250.

From the viewpoints of the viscosity of the polymerizable monomer and the dry etching resistance, the number of the polymerizable groups and the number of the aromatic groups contained in a polymerizable monomer preferably satisfies as follows: the number of the polymerizable groups is equal or small to the number of the aromatic groups In such a case, a condensed aromatic ring such as naphthalene is regarded as having one aromatic group, and two aromatic rings which bond to each other through a bond such as biphenyl is regarded as having two aromatic groups.

When the polymerizable monomer is liquid at 25° C., the viscosity thereof is preferably 2 to 500 mPa·s at 25° C., more preferably 3 to 200 mPa·s, further more preferably 3 to 100 mPa·s. The polymerizable monomer is preferably liquid at 25° C., or solid having a melting point of 60° C. or less, more preferably liquid at 25° C.

Z preferably represents —$Z^1$—$Z^2$. $Z^1$ is a single bond, or a hydrocarbon group which may have a linking group containing a hetero atom in the chain thereof. $Z^2$ is an aromatic group which may have a substituent. $Z^2$ has a molecular weight of 90 or more.

$Z^1$ is preferably a single bond, or an alkylene group which may have a linking group containing a hetero atom in the chain of the linking group. $Z^1$ is more preferably an alkylene group not having a linking group containing a hetero atom in the chain thereof, more preferably a methylene group, or an ethylene group. Examples of the linking group containing a hetero atom include —O—, —C(=O)—, —S—, and a combination of an alkylene group and at least one of —O—, —C(=O)— and —S—. The number of the carbon atoms of $Z^1$ is preferably 1 to 3.

$Z^2$ is an aromatic group having a substituent having a molecular weight of 15 or more. The aromatic group contained in $Z^2$ is exemplified by a phenyl group and a naphthyl group, preferably a phenyl group having a substituent having a molecular weight of 15 or more. $Z^2$ is preferably composed of an aromatic group having a single ring.

$Z^2$ is also preferably a group in which two or more aromatic groups directly bond to each other, or a group in which two or more aromatic groups bond to each other via a linking group. The linking group is preferably —$CH_2$—, —O—, —C(=O)—, —S—, or a combination thereof.

Examples of a substituent which the aromatic group may have include a halogen atom (fluorine atom, chlorine atom, bromo atom, iodine atom), a linear, a branched, or a cyclic alkyl group, an alkenyl group, an alkynyl group, an aryl group, an acyl group, an alkoxycarbonyl group, an aryloxycarbonyl group, a carbamoyl group, a cyano group, a carboxyl group, a hydroxy group, an alkoxy group, an aryloxy group, an alkylthio group, an arylthio group, a heterocyclic-oxy group, an acyloxy group, an amino group, a nitro group, a hydrazino group, a heterocyclic group. A group which is substituted with those groups is also preferred.

The polymerizable monomer in the present invention is preferably in the form of liquid at 25° C. When the polymerizable monomer is in the form of liquid at 25° C., the viscosity at 25° C. is preferably 500 mPa·s, more preferably 300 mPa·s, further more preferably 100 mPa·s.

The amount of the compound represented by the formula to be added in the composition is preferably 10 to 100% by mass, more preferably 20 to 100% by mass, further more preferably 30 to 80% by mass.

The compound represented by the formula is also preferably represented by the following formula (II);

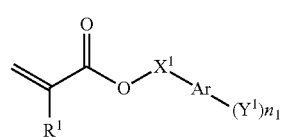

(II)

(In the formula: (II), $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3, wherein n1 is 0, $X^1$ is a hydrocarbon group having carbon atoms of 2 or more; and Ar is an aromatic linking group, preferably a phenylene group, and an aromatic group.)

$R^1$ is the same as $R^1$ in the above formula (I) and the preferable range thereof is the same as $R^1$ in the above formula (I).

$X^1$ is the same as $Z^1$ in the above and the preferable range thereof is the same as $Z^1$ in the above. $Y^1$ is a substituent having a molecular weight of 15 or more. Examples of $Y^1$ include an alkyl group, an alkoxy group, an aryloxy group, an alkenyl group, an aralkyl group, an acyl group, an alkoxycarbonyl group, an alkylthio group, an arylthio group, a halogen atom and a cyano group. Those substituents may have a substituent.

When n1 is 0, $X^1$ is preferably an alkylene group having carbon atoms of 2 or 3, and when n1 is 2, $X^1$ is preferably a single bond, or a hydrocarbon group having 1 carbon atom.

In particular, the more preferred embodiment is that n1 is 1 and $X^1$ is an alkylene group having 1 to 3 carbon atoms.

The compound represented by the formula (II) is more preferably represented by the following formula (III);

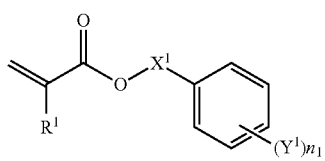

(III)

(In the formula (III), $R^1$ represents a hydrogen atom, an alkyl group, or a halogen atom; $X^1$ is a single bond, or a hydrocarbon group which may have a linking group containing a hetero atom in the chain of the linking group; $Y^1$ represents a substituent having a molecular weight of 15 or more; n1 represents an integer of 0 to 3. When n1 is 0, $X^1$ is a hydrocarbon group having 2 carbon atoms.)

$R^1$ is the same as $R^1$ in the above formula and the preferable range thereof is the same as $R^1$ in the above formula.

$X^1$ is the same as $Z^1$ in the above formula and the preferable range thereof is the same as $Z^1$ in the above formula.

$Y^1$ is the same as $Y^1$ in the above formula (II) and the preferable range thereof is the same as $Y^1$ in the above formula (II).

n1 is the same as n1 in the formula (II) and the preferable range thereof is the same as n1 in the formula (II).

The compound represented by the formula (III) is more preferably a compound represented by any one of the following formulae (IV) to (VI).

The compound represented by the formula (IV);

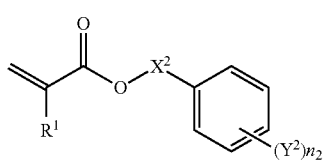

(IV)

(In the formula (IV), $R^1$ represents a hydrogen atom, an alkyl group, or a halogen atom; $X^2$ is a single bond, or a hydrocarbon group which may have a linking group containing a hetero atom in the chain of the linking group; $Y^2$ represents a substituent having a molecular weight of 15 or more, the substituent being other than an aromatic group-containing group; n2 represents an integer of 0 to 3, wherein n2 is 0, $X^2$ is a hydrocarbon group having carbon atoms of 2 or 3.)

$R^1$ is the same as $R^1$ in the above formula and the preferable range thereof is the same as $R^1$ in the above formula.

When $X^2$ is a hydrocarbon group, $X^2$ is preferably a hydrocarbon having carbon atoms of 1 to 3, more preferably a hydrocarbon having a substituted or non-substituted alkylene group having carbon atoms of 1 to 3, further more preferably a non-substituted alkylene group having carbon atoms of 1 to 3, even more preferably ethylene group. Adoption of such a hydrocarbon group makes it possible to provide a photocurable composition having lower viscosity and low volatile.

$Y^2$ represents a substituent which has a molecular weight of 15 or more and the substituent is not an aromatic group-containing group. The upper limit of the molecular weight of $Y^2$ is preferably 80 or less. Examples of $Y^2$ include an alkyl group having 1 to 6 carbon atoms such as methyl group, ethyl group, isopropyl group, tert-butyl group, and cyclohexyl group, a halogen atom such as chlorine atom and bromo atom, and an alkoxy group having 1 to 6 carbon atoms such as methoxy group, ethoxy group, and cyclohexyloxy group.

n2 is preferably an integer of 0 to 2. When n2 is 1, the substituent $Y^2$ is preferably at para-position in the compound. When n2 is 2, $X^2$ is preferably a single bond, or a hydrocarbon group having one carbon atom from the viewpoints of the viscosity of the composition.

The composition represented by the formula (IV) is preferably a monofunctional (meth)acrylate having one (meth)acrylate group.

The molecular weight of the (meth)acrylate represented by the formula (IV) is preferably 175 to 250, more preferably 185 to 245 from the viewpoint of attainment of the low viscosity and the low volatility.

The viscosity at 25° C. of the (meth)acrylate represented by the formula (IV) is preferably 10 mPa·s or less, more preferably 6 mPa·s or less.

In addition, the compound represented by the formula (IV) preferably is used for a reaction diluent.

The amount of the compound represented by the formula (IV) to be added is preferably 10% by mass or more, more preferably 15% by mass or more, further more preferably 20% by mass or more from the viewpoint of the viscosity of the composition and the pattern accuracy of the cured film. While the amount thereof to be added is preferably 95% by mass or less, more preferably 90% by mass or less, further more preferably 85% by mass or less from the viewpoint of the tackiness of the cured film and the mechanical strength of the cured film.

Specific examples of the compounds represented by Formula (IV) are shown below, to which, however, the present invention should not be limited. $R^1$ in the formulae below represents any of hydrogen atom, methyl group, and halogen atom.

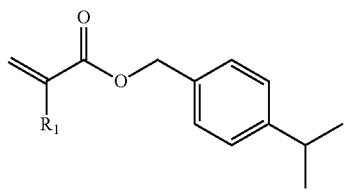

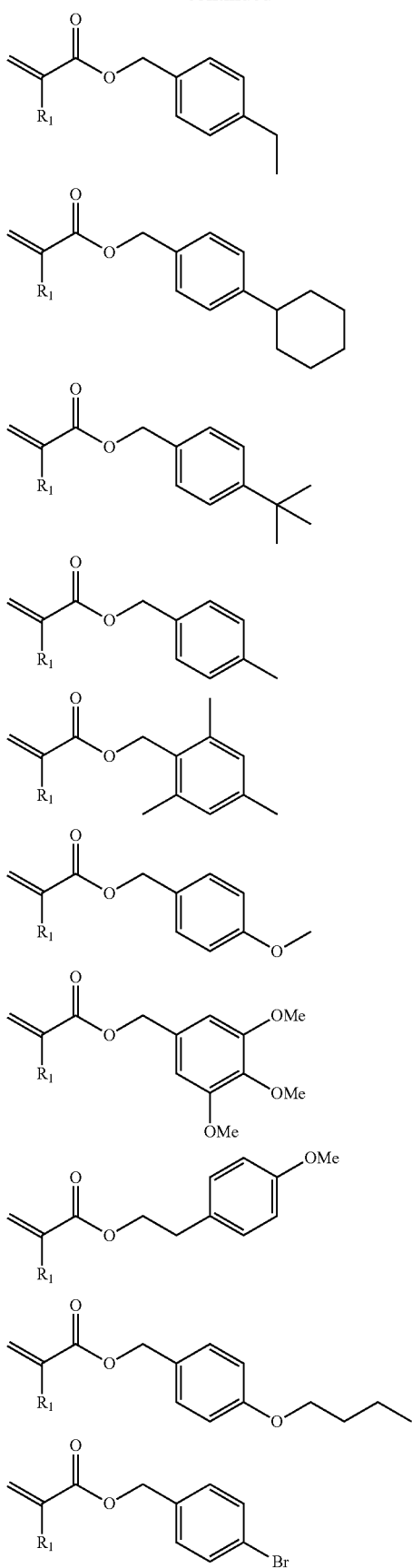

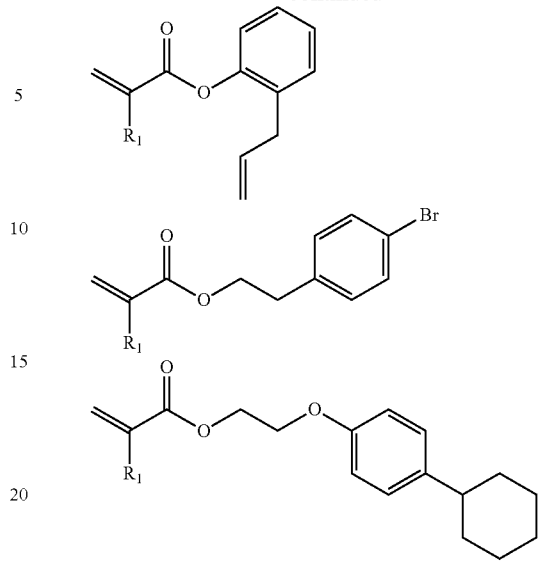

The compound represented by the formula (V);

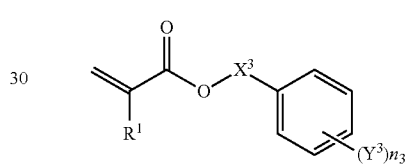

(V)

wherein $R^1$ represents a hydrogen atom, an alkyl group, or a halogen atom; $X^3$ is a single bond, or a hydrocarbon group which may have a linking group containing a hetero atom in the chain of the linking group; $Y^3$ represents a substituent having an aromatic group and having a molecular weight of 15 or more; and n3 represents an integer of 1 to 3.

$R^1$ is the same as $R^1$ in the above formula (I) and the preferable range thereof is the same as $R^1$ in the above formula (I).

$X^1$ is the same as $Z^1$ in the above formula and the preferable range thereof is the same as $Z^1$ in the above formula.

$Y^3$ represents a substituent having an aromatic group, and a preferred embodiment of the substituent having an aromatic group is the embodiment that an aromatic group bonds to the aromatic ring in the formula (V) directly, or via a linking group. Preferred example of the linking group thereof include an alkylene group, a linking group containing a hetero atom (preferably —O—, —S—, —C(=O)O—) and a combination thereof. Among them, an alkylene group, —O— and a combination thereof is more preferable. Embodiment in which a phenyl group bonds to the aromatic ring in the formula (V) directly, or via the above mentioned linking group is preferable. The substituent is preferably a phenyl group, a benzyl group, a phenoxy group, a benzyloxy group or a phenylthio group. The molecular weight of $Y^3$ is preferably 230 to 350.

n3 is preferably 1 or 2, more preferably 1.

The amount of the compound represented by the formula (V) to be added is preferably 10% by mass or more, more preferably 20% by mass or more, further more preferably 30% by mass or more. On the other hand, the amount thereof is preferably 90% by mass or less, more preferably 80% by mass or less, further more preferably 70% by mass, from the viewpoint of the tackiness and mechanical strength of the cured film.

Specific examples of the compounds represented by Formula (V) are shown below, to which, however, the present invention should not be limited. $R^1$ in the formulae below represents any of hydrogen atom, methyl group, and halogen atom.

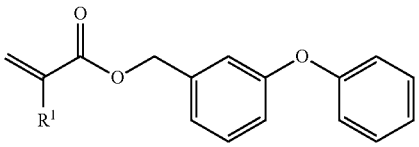

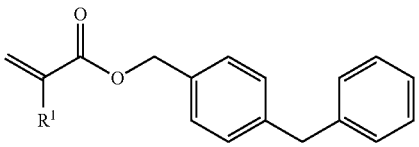

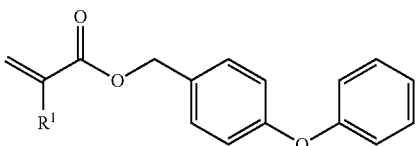

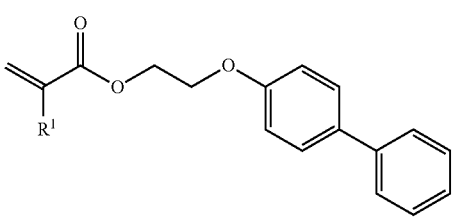

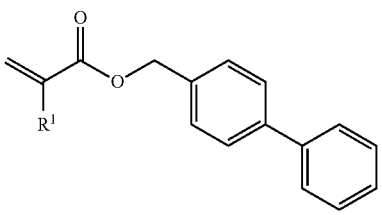

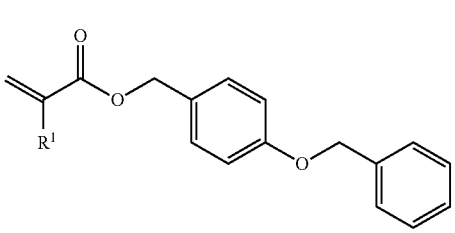

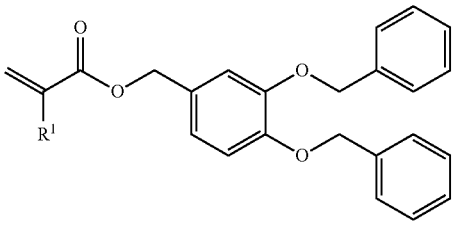

The compound represented by the formula (VI);

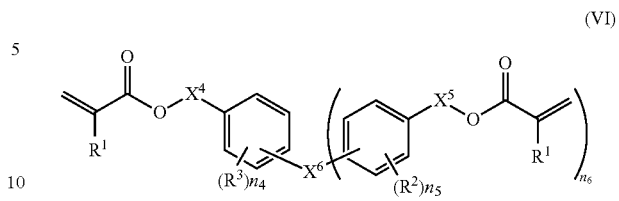

(VI)

wherein $X^6$ is a (n6+1)-valent linking group; $R^1$ each are a hydrogen atom, an alkyl group, or a halogen atom; $R^2$ and $R^3$ each are a substituent; n4 and n5 each are an integer of 0 to 4; n6 is 1 or 2; and $X^4$ and $X^5$ each are a hydrocarbon group which may have a linking group containing a hetero atom in the chain of the linking group.

$X^6$ is a (n6+1)-valent linking group, preferably an alkylene group, —O—, —S—, —C(=O)O—, or a linking group consisting of a combination of two or more thereof. The alkylene group is preferably an alkylene group having 1 to 8 carbon atoms, more preferably an alkylene group having 1 to 3 carbon atoms. Also, the alkylene group is preferable an unsubstituted alkylene group.

n6 is preferably 1. When n6 is 2, the plural $R^1$, $X^5$ and $R^2$ existing in the formula may be the same or different.

$X^4$ and $X^5$ each are an alkylene group not having a linking group, more preferably an alkylene group having 1 to 5 carbon atoms, further more preferably an alkylene group having 1 to 3 carbon atoms, still more preferably a methylene group.

$R^1$ is the same as $R^1$ in the above formula and the preferable range thereof is the same as $R^1$ in the above formula.

$R^2$ and $R^3$ each represent a substituent, preferably an alkyl group, a halogen atom, an alkoxy group, an acyl group, an acyloxy group, an alkoxycarbonyl group, a cyano group, a nitro group. The alkyl group is preferably an alkyl group having 1 to 8 carbon atoms. The halogen atom is exemplified by fluorine atom, chlorine atom, bromine atom and iodine atom, and is preferably fluorine atom. The alkoxy group is preferably an alkoxy group having 1 to 8 carbon atoms. The acyl group is preferably an acyl group having 1 to 8 carbon atoms. The acyloxy group is preferably an acyloxy group having 1 to 8 carbon atoms. The alkoxycarbonyl group is preferably an alkoxycarbonyl group having 1 to 8 carbon atoms.

n4 and n5 each are an integer of 0 to 4. When n4 or n5 is two or more, the plural $R^2$ and $R^3$ existing in the formula may be the same or different.

The compound represented by the formula (VI) is preferably a compound represented by the formula (VII);

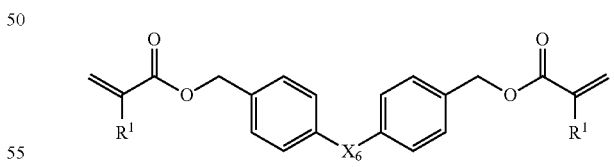

wherein $X^6$ represents an alkylene group, —O—, —S—, or a linking group which is combined with two or more thereof; $R^1$ each are a hydrogen atom, an alkyl group, or a halogen atom.

$R^1$ is the same as $R^1$ in the above formula (I) and the preferable range thereof is the same as $R^1$ in the above formula (I).

When $X^6$ is an alkylene group, the alkylene group is preferably an alkylene group having 1 to 8 carbon atoms, more preferably an alkylene group having 1 to 3 carbon atoms. The alkylene group is preferably an unsubstituted alkylene group.

$X^6$ is preferably —$CH_2$—, —$CH_2CH_2$—, —O—, or —S—.

The amount of the compound represented by the formula (VI) to be contained in the composition of the present invention is not defined. However, the content relative to the total amount of the polymerizable monomers is preferably 1 to 100% by mass, more preferably 5 to 70% by mass, further more preferably 10 to 50% by mass from the viewpoint of the curability and the viscosity of the composition.

Specific examples of the compounds represented by Formula (VI) are shown below, to which, however, the present invention should not be limited, wherein $R^1$ in the following is the same as $R^1$ in the above formula (VI), the preferable range thereof is the same as $R^1$ in the above formula (VI). The $R^1$ is more preferably a hydrogen atom.

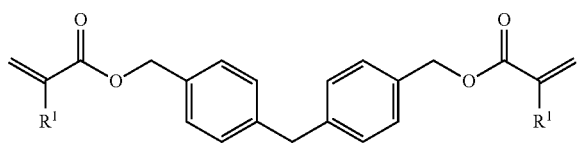

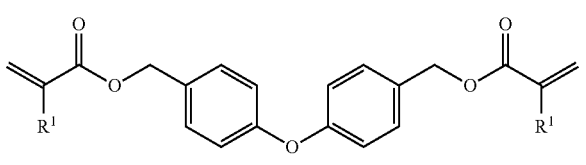

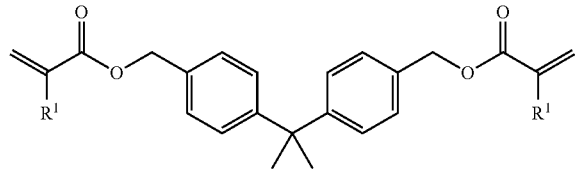

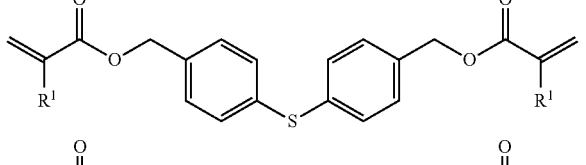

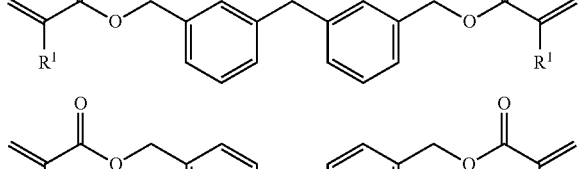

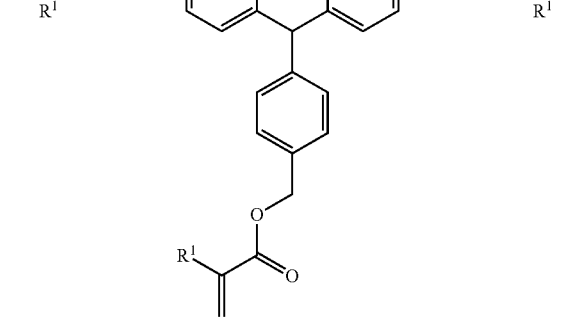

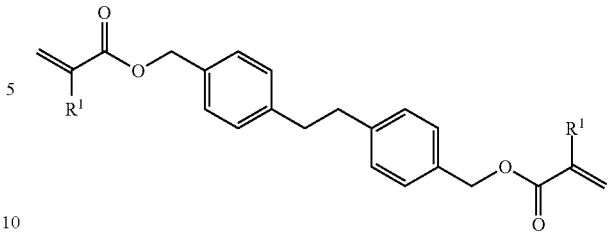

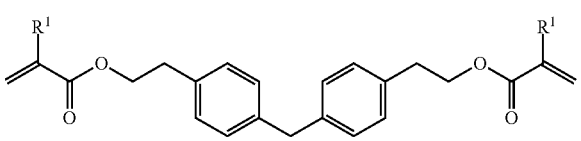

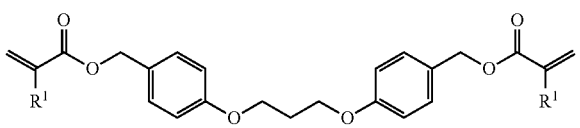

A polymerizable monomers for use in the invention is also exemplified by a polymerizable monomers represented by the following formula;

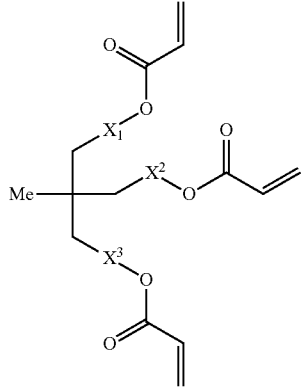

(In the formula, $X^1$ to $X^3$ each independently are a single bond, or a linking group. Me stands for methyl group)

When $X^1$ to $X^3$ is a linking group, it is preferably an organic linking group, which is preferably an organic group having carbon atoms of 1 to 50. Specific examples of the organic linking group include oxyalkylene group, —O—C(=O) alkylene group, and a group comprising at least two of those groups. The oxyalkylene group is exemplified by ethylene oxide group, or propylene oxide group. The alkylene group is exemplified by propylene group, butylene group, pentyl group, or hexyl group. $X^1$ to $X^3$ is preferably a single bond. The compound represented by the formula is preferably liquid at 25° C., but it may not be liquid.

Hereinunder, specific examples of the polymerizable monomers in the present invention are shown below.

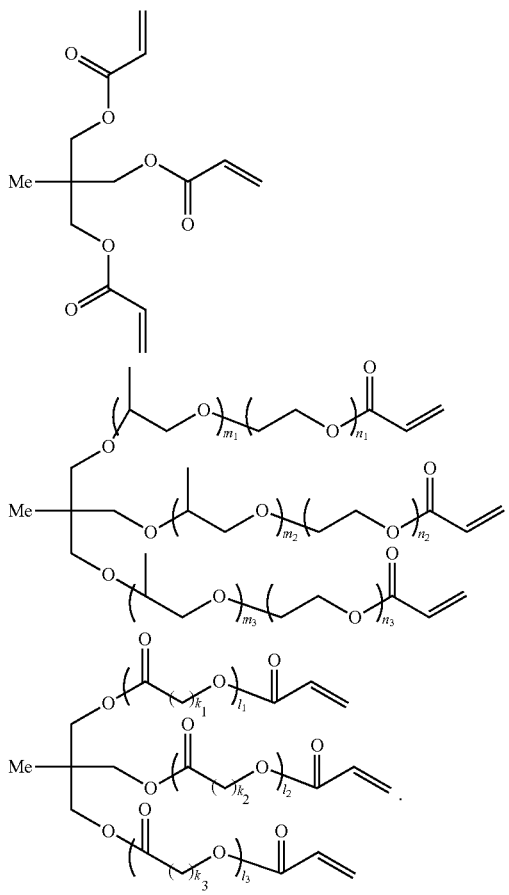

wherein $m^1$, $m^2$, $m^3$, $n^1$, $n^2$, $n^3$ each are an integer of 0 to 10. The sum of $m^1$, $m^2$, $m^3$, $n^1$, $n^2$ and $n^3$ is more than 1, or a mixture of compounds in which the average of the sum of $m^1$, $m^2$, $m^3$, $n^1$, $n^2$ and $n^3$ is more than 1.

A polymerizable monomer for use in the invention is also exemplified by a polymerizable monomer represented by the following formula;

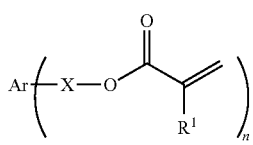

(I)

wherein Ar is an arylene group which may have a substituent, X is a single bond or an organic linking group, $R^1$ is hydrogen atom or methyl group, and n is 2 or 3.

In the formula, the above arylene group is exemplified by a hydrocarbon arylene group such as phenylene group and naphthylene group and a heteroarylene group which is a crosslinking group derived from indole or carbazole, and is preferably phenylene group from the viewpoints of the viscosity and the etching resistance. The above arylene group may have a substituent, and examples of the preferable substituent thereof include an alkyl group, an alkoxy group, hydroxy group, an alkoxycarbonyl group, an amide group, and a sulfone amide group.

The organic linking group in the above X is exemplified by an alkylene group, an arylene group and an aralkylene group which may include a hetero atom in the chain. Of those, preferred are an alkylene group and an arylene group, more preferred is an alkylene group. The above X is particularly preferably a single bond or an alkylene.

The above $R^1$ is hydrogen atom or methyl group, preferably hydrogen atom.

n is 2 or 3, preferably 2.

The above polymerizable monomer is preferably the following formula (I-a) or the following formula (I-b) from the viewpoint of reduction of the viscosity of the composition.

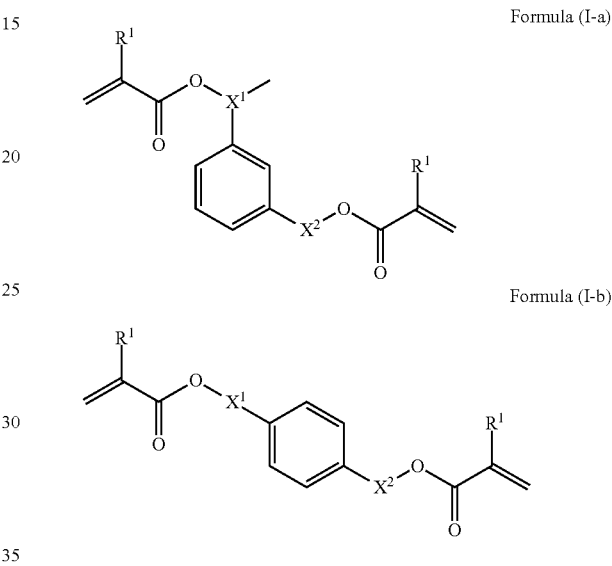

wherein $X^1$ and $X^2$ each independently are a single bond or an alkylene group which may have a substituent having 1 to 3 carbon atoms, $R^1$ is hydrogen atom or methyl group.

In the formula (I-a), the above $X^1$ is preferably a single bond or methylene group, more preferably methylene group from the viewpoint of reduction of the viscosity.

The preferred range of the above $X^2$ is the same as the above $X^1$.

The above $R^1$ is the same as $R^1$ in the above formula (VIII) and the preferred range is also the same.

The above polymerizable monomer is preferably liquid at 25° C. since liquid can control occurring foreign substance if the amount to be added thereof is increased.

Specific examples of the preferable polymerizable monomer are shown below. $R^1$ in the following monomer is the same as $R^1$ in the above formula, that is, $R^1$ is hydrogen atom or methyl group. The invention is not limited thereto.

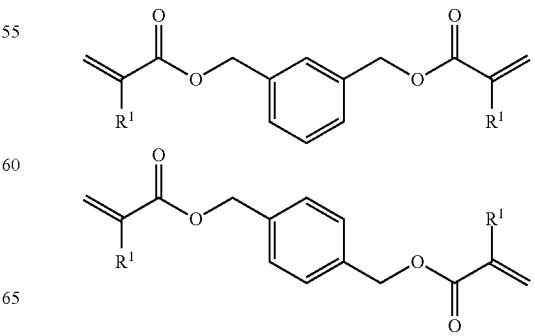

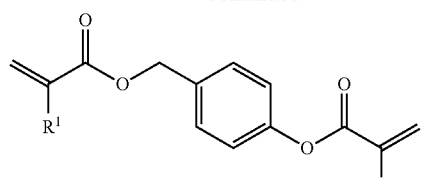
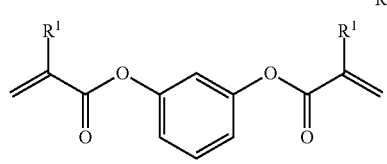
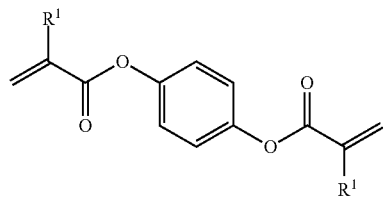
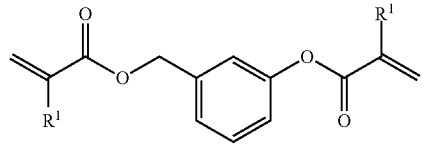
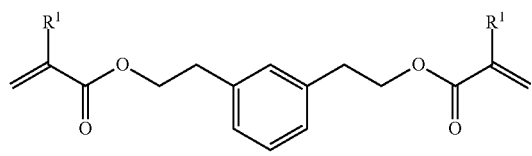
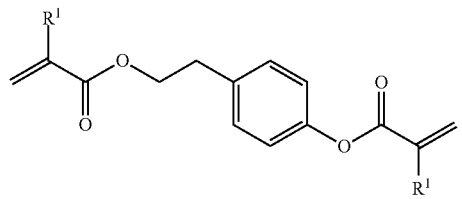
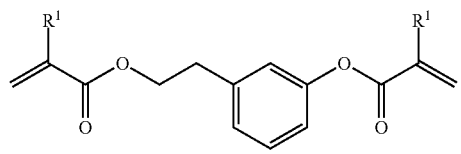
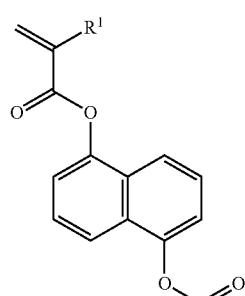
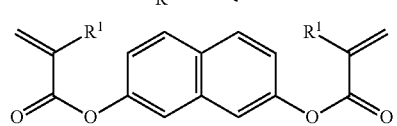

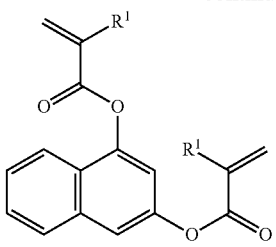
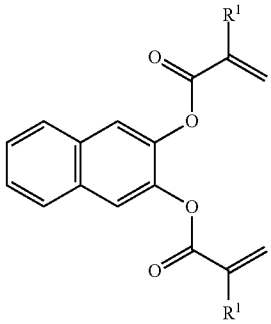
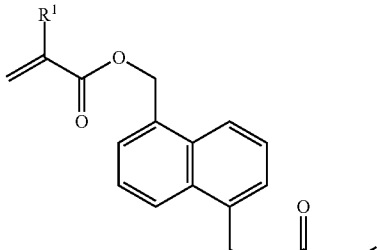
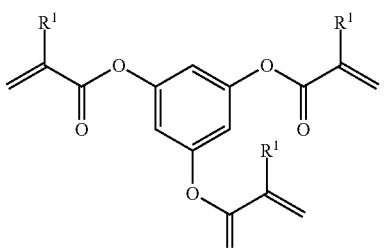
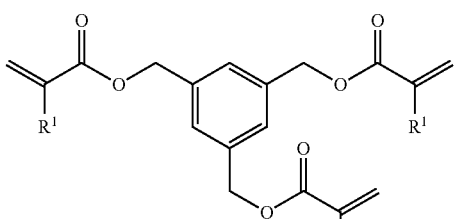

Among these polymerizable monomers, (meth)acrylate compound is preferable as the polymerizable monomer (A), from the viewpoints of viscosity of composition and photo-curability, and an acrylate is more preferable. In the present invention, a multi-functional polymerizable monomer having two or more polymerizable functional groups is preferable.

In the present invention, ratio of mixing of monofunctional (meth)acrylate compound and multi-functional (meth)acrylate compound is particularly preferably 80/20 to 0/100 on the weight basis, more preferably 70/30 to 0/100, and still more preferably 40/60 to 0/100. By selecting an appropriate ratio, the composition will have a sufficient level of curability, and low viscosity.

In the multi-functional (meth)acrylate compound, ratio of the bifunctional (meth)acrylate and the (meth)acrylate having three or higher degree of functionality is preferably 100/0 to 20/80 on the mass basis, more preferably 100/0 to 50/50, and still more preferably 100/0 to 70/30. Since the (meth)acrylate having three or higher degree of functionality has viscosity larger than that of the bifunctional (meth)acrylate, so that the curable composition for imprints of the present invention, having larger content of bifunctional (meth)acrylate, may be more preferable in view of reducing the viscosity.

The polymerizable monomer (A) component preferably contains a polymerizable monomer having an aromatic structure and/or alicyclic hydrocarbon structure, in view of improving dry etching resistivity and line edge roughness after dry etching. The polymerizable monomer (A) component preferably contains 50% by mass or more, and more preferably 80% by mass or more, of polymerizable monomer having an aromatic structure and/or alicyclic hydrocarbon structure. The polymerizable monomer having an aromatic structure is preferably a (meth)acrylate compound having an aromatic structure. Preferable examples of the polymerizable monomer having an alicyclic hydrocarbon structure include isoboronyl (meth)acrylate, dicyclopentanyl (meth)acrylate, dicyclopentanyl oxyethyl (meth)acrylate, dicyclopentenyl (meth)acrylate, adamantyl (meth)acrylate, tricyclodecanyl (meth)acrylate, and tetracyclododecanyl (meth)acrylate.

For the case where (meth)acrylate is used as the polymerizable monomer (A), acrylate is preferred over methacrylate.

Total content of the polymerizable monomer (A) in the curable composition for imprints of the present invention, excluding the solvent, is preferably 50 to 99.5% by mass, more preferably 70 to 99% by mass, and particularly preferably 90 to 99% by mass, in view of improving the curability, and improving viscosity of the curable composition for imprints of the present invention.

In the curable composition for imprints of the present invention, it is preferable that the content of polymerizable monomer having a viscosity at 25° C. of 3 to 100 mPa·s accounts for 80% by mass or more of the total polymerizable monomer (A) component, it is more preferable that the content of polymerizable monomer having a viscosity of 3 to 70 mPa·s accounts for 80% by mass or more, it is still more preferable that the content of polymerizable monomer having a viscosity of 7 to 50 mPa·s accounts for 80% by mass or more, and it is most preferable that the amount of polymerizable monomer having a viscosity of 8 to 30 mPa·s accounts for 80% by mass or more.

The viscosity of the curable composition for imprints of the present invention at 25° C. is preferably 5 to 50 mPa·s, more preferably 6 to 40 mPa·s, still more preferably 7 to 30 mPa·s, and most preferably 8 to 25 mPa·s. By adjusting the viscosity of composition to 5 to 50 mPa·s, the mold filling performance may be improved, and square pattern profile may more readily be obtained even under low mold stamping pressure in the process of imprint. The method of the present invention expresses distinctive effects particularly when a low-viscosity polymerizable monomer is used. In the polymerizable monomer (A) contained in the curable composition for imprints of the present invention, the amount of a polymerizable monomer which exists in a form of liquid at 25° C. preferably is 50% by mass or more of the total polymerizable monomer, from the viewpoint of stability over time.

The present invention also includes a method of manufacturing a polymerizable monomer for imprint, which includes a step of removing a polymer impurity containing the polymerizable monomer (A) as a repeating unit; a method of manufacturing a curable composition for imprints, which includes the above-described method of manufacturing a polymerizable monomer for imprint; and a curable composition for imprints, which contains the polymerizable monomer manufactured by the above-described method of manufacturing a polymerizable monomer for imprint.

Herein, the impurity polymer is inevitably produced during manufacturing and storage of the polymerizable monomer (A), and during manufacturing and storage of the curable composition for imprints, due to polymerization among molecules of the polymerizable monomer (A). This is, therefore, totally different from polymer additive such as surfactant.

In the present invention, if two or more species of the polymerizable monomer (A) are contained, the polymer containing the polymerizable monomer (A) as the repeating units includes homopolymers derived from the individual polymerizable monomers, and copolymer derived from two or more species of polymerizable monomer.

The present inventors found out from our investigations that it is difficult to detect a ultra-trace amount of polymer impurity by GPC, from the polymerizable monomer composition which contains the polymerizable monomer and the polymer containing the polymerizable monomer as a repeating unit, such as those commercially available as the polymerizable monomer. The present inventors also found that even a trace amount of polymer, and therefore cannot be detected by GPC, may adversely affect the imprint pattern. From this point of view, the polymerizable monomer composition contained in the curable composition of the present invention preferably shows a turbidity of 1,000 ppm or below when dissolved in a solvent capable of dissolving therein the polymerizable monomer contained in the curable composition, but incapable of, or nearly incapable of dissolving therein the polymer containing the polymerizable monomer as a repeating unit, so as to adjust the total content of the polymerizable monomer and the polymer containing the polymerizable monomer as a repeating unit, contained in the curable composition, to 10% by mass of the solvent. The turbidity is more preferably 700 ppm or below, still more preferably 500 ppm or below, furthermore preferably 100 ppm, particularly preferably 10 ppm or below, and most preferably 1 ppm or below.

The solvent herein is characterized in that the solubility of the polymer ingredient is 5% by mass or less, preferably 1% by mass or less, and the solvent is preferably contains hydrocarbon solvent (pentane, hexane, heptane, toluene, xylene, benzene, etc.), or alcoholic solvent (methanol, ethanol, 1- or 2-propanol, 1- or 2-butanol, etc.).

The polymer component in the context of the present invention means a component having molecular weight larger than that of the polymerizable monomer (A), and also contains oligomer. The polymer component preferably has a weight-average molecular weight, measured by GPC, of 10,000 or larger, more preferably 30,000 or larger, still more preferably 50,000 or larger, and most preferably 100,000 or larger. The curable composition may degrade the pattern transferability in imprint, if the polymer component of particularly large molecular weight is contained therein.

While a wide variety of publicly-known methods may be adoptable to the process of removing the polymer containing the polymerizable monomer as a repeating unit, from the polymerizable monomer composition which contains the polymerizable monomer and the polymer containing the polymerizable monomer as a repeating unit, the method preferably includes a step of mixing a solvent capable of dissolving at least one species of the polymerizable monomer, but incapable of, or nearly incapable of dissolving the polymer containing the polymerizable monomer as a repeating unit, with the polymerizable monomer composition; and allowing the polymer to deposit. Concentration of the polymerizable monomer composition to be mixed is preferably 1 to 99% by mass, more preferably 3 to 50% by mass, still more preferably 5 to 30% by mass, and most preferably 5 to 20% by mass.

The polymerizable monomer (A), after being separated from the deposited polymer, is then added to the curable composition for imprints, in a form of the resultant solution without further treatment, or after condensation or replacement of solvent. In the present invention, it is also preferable to add a polymerization inhibitor in the manufacturing process of the polymerizable monomer, wherein it is more preferable to add it in the preceding stage of condensation.

The technique of the present invention expresses distinct effects particularly when adapted to high-boiling-point polymerizable monomer which cannot readily be purified by distillation. Boiling point of the polymerizable monomer, to which the present invention may preferably be adoptable, is 200° C. or above at 1 atm, more preferably 250° C. or above, and still more preferably 300° C. or above. For the case where the boiling point at 1 atm cannot readily be measured, the boiling point is measured under reduced pressure, and the thus-obtained boiling point under reduced pressure is converted to boiling point at 1 atm, based on the degree of reduction in pressure.

The technology of the present invention is particularly effective when it is used for a polymerizable monomer (A) having two or more functional groups. The polymer derived from the polymerizable monomer having two or more functional groups has a crosslinking structure to easily produce a polymer having a high weight molecular. Thereby, such a polymer causes deterioration of patternability at the time of imprinting, and the deterioration is suppressed by reducing the content of the polymer.

(B) Photo-Polymerization Initiator

The curable composition for imprints of the present invention contains a photo-polymerization initiator. The photo-polymerization initiator used in the present invention may be anything so far as it can generate, upon irradiation of light, an active species which promotes polymerization of the polymerizable monomer (A). The photo-polymerization initiator may be exemplified by cationic polymerization initiator and radical polymerization initiator, wherein the radical polymerization initiator is preferable. In the present invention, a plurality of species of photo-polymerization initiator may be used in combination.

Content of the photo-polymerization initiator used for the present invention, relative to the total composition excluding solvent, is typically 0.01 to 15% by mass, preferably 0.1 to 12% by mass, and still more preferably 0.2 to 7% by mass. For the case where two or more species of photo-polymerization initiators are used, the total amount is adjusted to the above-described ranges.

A content of photo-polymerization initiator of 0.01% by mass or above is preferable since the sensitivity (quick curability), resolution, line edge roughness, and film strength tend to improve. On the other hand, a content of photo-polymerization initiator of 15% by mass or less is preferable since the transmissivity of light, coloration and handlability tend to improve. In a system containing dye and/or pigment, they may occasionally act as a radical trapping agent, and may therefore adversely affect the photo-polymerization performance and sensitivity. Taking this point into consideration, the amount of addition of the photo-polymerization initiator is optimized for this sort of application. In contrast, dye and/or pigment are not essential components in the composition used for the present invention, so that the optimum range of the photo-polymerization initiator may be different from those of curable composition for ink jet process or curable composition for color filters of liquid crystal display devices.

Commercially available initiators may be adoptable to the radical photo-polymerization initiator in the present invention. Those described in paragraph [0091] in Japanese Laid-Open Patent Publication No. 2008-105414 may preferably be used. Among them, acetophenone-base compound, acylphosphine oxide-base compound, and oxime ester-base compound are preferable from the viewpoint of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy) phenyl]-2-hydroxy-2-methyl-1-propane-1-one, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from Ciba Specialty Chemicals Inc.

The dialkoxyacetophenone-base compound may preferably be exemplified by Irgacure (registered trademark) 651 (2,2-dimethoxy-1,2-diphenylethane-1-one) available from Ciba Specialty Chemicals Inc.

The aminoacetophenone-base compound may preferably be exemplified by Irgacure (registered trademark) 369 (2-benzyl-2-dimethylamino-1-(4-morpholinophenyl)butanone-1), Irgacure (registered trademark) 379 (EG) (2-dimethylamino-2-(4-methylbenzyl)-1-(4-morpholine-4-yl-phenyl)butane-1-one, and Irgacure (registered trademark) 907 (2-methyl-1-[4-methylthiophenyl]-2-morpholinopropane-1-one), all of which are available from Ciba Specialty Chemicals Inc.

The acylphosphine oxide-base compound may preferably be exemplified by Irgacure (registered trademark) 819 (bis(2, 4,6-trimethylbenzoyl)-phenylphosphine oxide), and Irgacure (registered trademark) 1800 (bis(2,6-dimethoxybenzoyl)-2, 4,4-trimethyl-pentylphosphine oxide), all of which are available from Ciba Specialty Chemicals Inc.; and Lucirin TPO (2,4,6-trimethylbenzoyldiphenylphosphine oxide), and Lucirin TPO-L (2,4,6-trimethylbenzoylphenylethoxyphosphine oxide), all of which are available from BASF.

The oxime ester-base compound may preferably be exemplified by Irgacure (registered trademark) OXE01 (1,2-octanedione, 1-[4-(phenylthio)phenyl]-2-(O-benzoyloxime)), and Irgacure (registered trademark) OXE02 (ethanone,1-[9-ethyl-6-(2-methylbenzoyl)-9H-carbazole-3-yl]-1-(O-acetyloxime)), all of which are available from Ciba Specialty Chemicals Inc.

The cation photo-polymerization initiator adoptable to the present invention is preferably sulfonium salt compound, iodonium salt compound, and oxime sulfonate compound, and may preferably be exemplified by 4-methylphenyl [4-(1-methylethyl)phenyliodonium tetrakis(pentafluorophenyl) borate (PI2074, from Rhodia), 4-methylphenyl[4-(2-methylpropyl)phenyliodonium hexafluorophophate (Irgacure 250, from Ciba Specialty Chemicals Inc.), Irgacure PAG103, 108, 121 and 203 (from Ciba Specialty Chemicals Inc.).

While it is necessary to appropriately select the photo-polymerization initiator adoptable to the present invention depending on wavelength of a light source to be employed, those not anticipated to produce gas during stamping with a mold, or during exposure of light may be preferable. Production of gas may result in fouling of the mold, frequent need of cleaning of the mold, and degradation of accuracy of transferred pattern due to deformation of the photo-curable composition in the mold.

The curable composition for imprints of the present invention is preferably a radical-polymerizable curable composition which contains a radical polymerizable monomer as the polymerizable monomer (A), and a radical polymerization initiator which generates a radical upon irradiation of light as the (B) photo-polymerization initiator.

(Other Ingredients)

In accordance with various objects, in addition to the above ingredient, the curable composition for imprints of the invention may contain any other ingredients such as surfactant, antioxidant and polymer without impairing the effect of the invention.

—Surfactant—

Preferably, the curable composition for imprints of the invention contains a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferably, the composition contains at least one of a non-ionic surfactant, more preferably a fluorine-containing surfactant, a silicone-type surfactant, a fluorine-containing silicone-type surfactant, further more preferably contains both of a fluorine-containing surfactant and a silicone-type surfactant, or contains a fluorine-containing silicone-type surfactant, most preferably contains a fluorine-containing silicone-type surfactant. The fluorine-containing surfactant and the silicone-type surfactant are preferably non-ionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the composition of the invention in the cavity of a female mold, for enhancing the mold-resist releasability, for enhancing the resist adhesiveness to substrates, and for lowering the viscosity of the composition. In particular, when the above-mentioned surfactant is added to the composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include the surfactants disclosed at paragraph 0097 in JP-A-2008-105414.

—Antioxidant—

Preferably, the curable composition for imprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photo-irradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoints of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab A070, A080, A0503 (by Adeka), etc. These may be used either singly or as combined.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

The polymerization inhibitor may be exemplified by hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), cerium (III) salt of N-nitrosophenyl hydroxylamine, phenothiazine, phenoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline; among which preferable examples include p-benzoquinone, 2,2,6,6-tetramethylpiperidine-1-oxyl, free radical, 4-hydroxy-2,2,6,6-tetramethylpiperidine-1-oxyl, free radical, and phenothiazine. The polymerization inhibitor suppresses production of the polymer impurity not only in the process of manufacturing the polymerizable monomer, but also during storage of the curable composition, and thereby suppresses degradation of pattern formability in the process of imprint.

—Solvent—

A solvent may be used for the curable composition for imprints of the invention, in accordance with various needs. In the specification, "solvent" does not include the above polymerizable monomer. That is, the solvent in the specification, "solvent" does not have a polymerizable functional group. In particular, when a pattern having a thickness of at most 500 nm is formed, the composition preferably contains a solvent. Preferably, the solvent has a boiling point at a pressure of 1 atmosphere of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition of the invention may be suitably optimized depending on the viscosity of the constitutive ingredients except the solvent, the coatability of the composition and the intended thickness of the film to be formed. From the viewpoint of the coatability, the solvent content may be 99% or less by mass of the composition, and, in general, the solvent is not substantively contained in the curable composition of the invention (for example 3% by mass or less). In forming a patter having a thickness of at most 500 nm by a spin coating or the like, the solvent content may be preferably from 20 to 99% by mass, preferably from 40 to 99% by mass, even more preferably from 70 to 98% by mass.

In addition to the above-mentioned ingredients, the curable composition for imprints of the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

In the method for producing a curable composition for imprints of the present invention, the ingredients as mentioned above may be mixed and then, filtered. The mixing and dissolving are generally carried out in a range of from 0° C. to 100° C., preferably in a range from 10° C. to 40° C.

The curable composition for imprints of the invention may form a finer micropattern through photo-imprint lithography, at low cost and with high accuracy. Accordingly, the composition of the invention can form micropatterns heretofore formed according to conventional lithography at low cost and with high accuracy. For example, when the composition of the invention is applied onto a substrate and the composition layer is exposed to light, cured and exposed and cured, and dried if necessary, then permanent films of overcoat layers or insulating films for use in liquid-crystal displays (LCD) may be formed and the formed films may be used as an etching resist in producing semiconductor integrated circuits, recording materials or flat panel displays.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1000 ppm, more preferably at most 10 ppm, even more preferably at most 100 ppb.

[Patterning Method]

The patterning method (especially micropatterning method) of using the curable composition for imprints of the invention is described below. The patterning method of the invention comprises applying the curable composition for imprints of the invention onto a substrate or a support (base) to form a patterning layer thereon; pressing a mold against the surface of the patterning layer; and irradiating the patterning layer with light, thereby curing the composition of the invention to form a micropattern.

Preferably, the curable composition for imprints of the invention is, after irradiated with light, further heated and cured. Concretely, at least the composition of the invention is applied onto a substrate (base or support) and optionally dried to form a layer comprising the composition of the invention (patterning layer), thereby preparing a pattern acceptor (having the patterning layer formed on the substrate), then a mold is pressed against the surface of the patterning layer of the pattern acceptor to thereby transfer the mold pattern onto the pattern acceptor, and the resulting micropatterned layer is cured through photo-irradiation. The photo-imprint lithography of the patterning method of the invention may enable lamination and multi-layer patterning, and therefore may be combined with ordinary imprint technology.

The patterning method (pattern transferring method) with the curable composition for imprints of the invention is described concretely hereinunder.

In the patterning method of the invention, the composition of the invention is first applied (preferably coated) onto a support to form a patterning layer thereon.

The coating method for applying the curable composition for imprints of the invention onto a substrate may be a well known coating method of, for example, a dip coating method, an air knife coating method, a curtain coating method, a wire bar coating method, a gravure coating method, an extrusion coating method, a spin coating method, a slit scanning method, an inkjet method, etc. The thickness of the patterning method of the composition of the invention may vary depending on the use thereof, and may be from 0.03 μm to 30 μm or so. In the case where droplets are applied on a substrate by an inkjet method, the amount of the droplets is preferably 1 pl to 20 pl. Between the substrate and the patterning method of the composition of the invention, any other organic layer may be formed, such as a planarizing layer, etc. With that, the patterning layer is not kept in direct contact with the substrate, and therefore, the substrate may be prevented from being contaminated with dust or from being scratched, and the adhesiveness of the patterning layer to the substrate may be enhanced. The pattern to be formed of the composition of the invention may have good adhesiveness to the organic layer, if any, formed on the substrate.

The substrate (base or support) to which the curable composition for imprints of the invention is applied may be selected from various materials depending on its use, including, for example, quartz, glass, optical film, ceramic material, vapor deposition film, magnetic film, reflective film, metal substrate of Ni, Cu, Cr, Fe or the like, paper, SOG (spin on glass), polymer substrate such as polyester film, polycarbonate film or polyimide film, TFT array substrate, PDP electrode plate, glass or transparent plastic substrate, electroconductive substrate of ITO, metal or the like, insulating substrate, semiconductor substrate such as silicon, silicon nitride, polysilicon, silicon oxide or amorphous silicon, which, however, are not limitative. The shape of the substrate is not also specifically defined. It may be tabular or roll. As described below, the substrate may be light-transmissive or non-light-transmissive, depending on the combination thereof with a mold.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

The mold material usable in the invention is described. IN the photo-imprint lithography with the composition of the invention, a light-transmissive material is selected for at least one of the mold material and/or the substrate. In the photo-imprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photo-imprints is applied onto a light-transmissive substrate, then a mold is pressed against it, and this is irradiated with light from the back of the substrate whereby the curable composition for photo-imprints can be cured.

The photo-irradiation may be attained while the mold is kept in contact with the layer or after the mold is released. In the invention, preferably, the photo-irradiation is attained while the mold is kept in contact with the patterning layer.

The mold usable in the invention has a transferable pattern formed thereon. The pattern of the mold may be formed, for example, through photolithography, electronic beam lithography or the like by which a pattern may be formed to a desired processing accuracy. In the invention, however, the mold patterning method is not specifically defined.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints of the invention from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photo-imprint lithography with the composition of the invention, in general, the mold pressure in the patterning method of the invention is preferably at most 10 atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photo-irradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the photo-imprint lithography applied to the invention, the substrate temperature in photo-irradiation may be room temperature; however, the photo-irradiation may be attained under heat for enhancing the reactivity. In the previous stage of photo-irradiation, preferably, the system is kept in vacuum as effective for preventing contamination with bubbles or contamination with oxygen or for preventing the reduction in reactivity, and as effective for enhancing the adhesiveness of the curable composition for imprints with mold. The system may be subjected to photo-irradiation while still kept in vacuum. In the patterning method of the invention, the vacuum degree in photo-irradiation is preferably from $10^{-1}$ Pa to ordinary pressure.

Light to be used for photo-irradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photo-exposure, the light intensity is preferably within a range of from 1 mW/cm$^2$ to 50 mW/cm$^2$. When the light intensity is at least 1 mW/cm$^2$, then the producibility may increase since the photo-exposure time may be reduced; and when the light intensity is at most 50 mW/cm$^2$, then it is favorable since the properties of the permanent film formed may be prevented from being degraded owing to side reaction. Also preferably, the dose in photo-exposure is within a range of from 5 mJ/cm$^2$ to 1000 mJ/cm$^2$. When the dose is less than 5 mJ/cm$^2$, then the photo-exposure margin may be narrow and there may occur problems in that the photo-curing may be insufficient and the unreacted matter may adhere to mold. On the other hand, when the dose is more than 1000 mJ/cm$^2$, then the composition may decompose and the permanent film formed may be degraded.

Further, in photo-exposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer is cured through photo-irradiation, if desired, the cured pattern may be further cured under heat given thereto. The method may additionally includes the post-curing step. Thermal curing of the composition of the invention after photo-irradiation is preferably attained at 150 to 280° C., more preferably at 200 to 250° C.

The heating time is preferably from 5 to 60 minutes, more preferably from 15 to 45 minutes.

[Pattern]

The pattern thus formed according to the patterning method of the invention as described in the above can be used as a permanent film (resist for structural members) for use in liquid-crystal displays (LCD) and others, or as an etching resist. After its production, the composition of the invention may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

The pattern formed by using the curable composition for imprints of the present invention is also excellent in solvent resistance. While it is preferable that the curable composition for imprints of the present invention is highly durable against a wide variety of solvents, it is particularly preferable that the curable composition does not cause variation in the film thickness typically when immersed in N-methylpyrrolidone, which is a solvent generally used in the process of manufacturing the substrate, at 25° C. for 10 minutes.

The pattern formed according to the patterning method of the invention is useful as an etching resist. In case where the composition for imprints of the invention is used as an etching resist, a nano-order micropattern is first formed on a substrate such as a silicon wafer with a thin film of $SiO_2$ or the like formed thereon, according to the patterning method of the invention. Next, this is etched with hydrogen fluoride in wet etching, or with $CF_4$ in dry etching, thereby forming a desired pattern on the substrate. The curable composition for imprints of the invention exhibits especially good etching resistance in dry etching.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

As the polymerizable monomer for use in the Example, the viscosity at 25° C. and the boiling point at 1 atom were shown in the following Table 1. The viscosity was measured at 25±0.2° C., using RE-80L-type relative viscosmeter manufactured by Toki Sangyo Co., Ltd.

(R1) Synthesis of Polymerizable Monomer, m-Xylylene Diacrylate

To 1000 ml of distillated water, 411 g of sodium hydroxide was added, and 781 g of acrylic acid was dropwisely added to the solution under ice. To the mixture, 107 g of benzyl tributylammonium chloride and 600 g of α,α'-dichlorometaxylene were added, and the mixture was allowed to react at 85° C. for 7 hours. To the reaction solution, 1600 ml of ethyl acetate was added, the organic layer was then sequentially washed with a 1% aqueous hydrochloric acid solution, a 1% aqueous tetramethylammonium hydroxide solution and distilled water, the organic layer was condensed in vacuo so as to reduce the solvent content to 1% by mass or below, to thereby obtain a crude product (polymerizable monomer composition) which contains polymerizable monomer (R1). (R1) was found to show a viscosity at 25° C. of 9.5 mPa·s. (R1) was also found to show a boiling point at 1 atm of 300° C. or higher.

(R2) Synthesis of Polymerizable Monomer, 2-naphtylmethyl Acrylate

Under nitrogen stream, 600 g of 2-methyl naphthalene was dissolved with 6000 ml of ethyl acetate, 422 g of 1,3-dibromo-5,5,dimethyl hydantoin was added thereto, and was heated up to 40° C. To this, 7.4 g of V-65 manufactured by Wako Pure Chemical Industries, Ltd was added and reacted at 40° C. for 7 hours. The reaction solution was treated at 65° C. for 3 hours, and then, was cooled. After the reaction solution was washed with aqueous solution of sodium hydrogen carbonate and distilled water, the reaction solution was concentrated. To this, 3600 ml of isopropanol was added and stirred for 30 minutes, and then, 900 ml of distilled water was added and stirred for 30 minutes. The deposited solid was filtered and separated. To this, 1800 ml of isopropanol was added and stirred for 30 minutes, and then, 450 ml of distilled water was added and stirred for 30 minutes. The solid was filtered and separated, and dried to obtain 300 g of 2 bromomethyl naphthalene.

To 200 ml of distilled water, 81.4 g of sodium hydroxide was added, and 147 g of acrylic acid was dropped thereto under storage in ice. To this, 42.4 g of benzyl tributyl ammonium chloride and 300 g of 2-bromomethyl naphthalene were added and reacted at 75° C. for 2 hours. After the reaction, 800 ml of a mixture of ethyl acetate/hexyane=2/8 (volum ratio) was added thereto, the organic phase was washed with 1% of aqueous solution of acidum hydrochloricum, 1% of tetramethylammonium hydroxy aqueous solution, and distilled water. To the organic phase, 0.01 g of p-benzoquinone as a polymerizable inhibitor was added and concentrated under vacuum so that the content of the solvent in the organic phase is 1% by mass or less, to thereby obtain the polymerizable monomer (R2). The viscosity of (R2) was 10.3 mPa·s at 25° C.

(R3) Polymerizable Monomer
Polyethylene grycol diacrylate #200: NK ester A-200 manufactured by Shin-Nakamura Chemical Co., Ltd.

(R4) The Following Compound

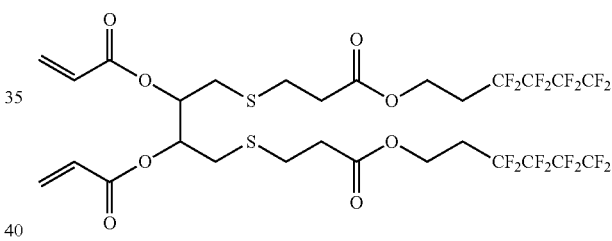

(Preparation of Curable Composition for Imprints)

The above polymerizable monomers were additionally synthesized in order to obtain the amount of the monomers enough to prepare the curable composition for imprints shown in Table 2. Using a filter shown in Table 1, the compounds were filtered under the condition shown in Table 2 to obtain the curable compositions (C-1) to (C-25).

Herein UPE stands for polyester resin, PTFE stands for fluorine resin. The total flows of the curable composition for imprints each were 1 L.

TABLE 1

| Filter | Effective filter area[cm²] | Pore size[μm] | Material | Style | Manufacturer |
|---|---|---|---|---|---|
| A | 600 | 0.2 | UPE | Pleated filter cartridge | Optimizer D600 by Japan Entegris |
| B | 300 | 0.05 | UPE | Pleated filter cartridge | Optimizer D300 by Japan Entegris |
| C | 1500 | 0.03 | UPE | Pleated filter cartridge | Optimizer D by Japan Entegris |
| D | 3000 | 0.1 | UPE | Pleated filter cartridge | Optimizer DPR-L by Japan Entegris |
| E | 3600 | 0.1 | PTFE | Pleated filter cartridge | Fluorogard AT by Japan Entegris |
| F | 1200 | 0.2 | UPE | Pleated filter cartridge | Impact by Japan Entegris |
| G | 17 | 0.1 | UPE | Disk type filter | UPE Disk filter CWAV04700 by Japan Entegris |
| H | 17 | 0.1 | PTFE | Disk type filter | PTFE Disk filter PTAL04700 by Japan Entegris |
| I | 64 | 0.1 | PTFE | Disk type filter | PTFE Disk filter PTAL09025 by Japan Entegris |
| J | 158 | 0.1 | PTFE | Disk type filter | PTFE Disk filter PTAL14200 by Japan Entegris |
| K | 2500 | 0.04 | Nylon66 | Pleated filter cartridge | PALL photo clean DDF |

TABLE 2

| Curable composition | Number | Polymerizable monomer | Weight/g | Polymerization initiator (20 g) | Surfactant (5 g) | Filter 1 |
|---|---|---|---|---|---|---|
| C-1 | Example 1 | R1 | 1000 | (P-1) | (W-1) | A |
| C-2 | Example 2 | R2 | 1000 | (P-2) | (W-2) | B |
| C-3 | Example 3 | R1/R3/R4 | 900/100/5 | (P-3) | — | C |
| C-4 | Example 4 | R1 | 1000 | (P-1) | (W-1) | D |
| C-5 | Example 5 | R2 | 1000 | (P-1) | (W-1) | E |
| C-6 | Example 6 | R2/R3 | 900/100 | (P-2) | (W-2) | F |
| C-7 | Example 7 | R1 | 1000 | (P-1) | (W-1) | K |
| C-8 | Example 8 | R1/R4 | 1000/5 | (P-3) | — | A |
| C-9 | Example 9 | R2 | 1000 | (P-1) | (W-1) | B |
| C-10 | Example 10 | R1/R3 | 900/100 | (P-2) | (W-2) | C |
| C-11 | Example 11 | R1 | 1000 | (P-1) | (W-1) | D |
| C-12 | Example 12 | R2 | 1000 | (P-2) | (W-2) | E |
| C-13 | Example 13 | R2/R3/R4 | 900/100/5 | (P-3) | — | F |
| C-14 | Example 14 | R1 | 1000 | (P-1) | (W-1) | A |
| C-15 | Example 15 | R2 | 1000 | (P-2) | (W-2) | B |
| C-16 | Example 16 | R1/R3/R4 | 900/100/5 | (P-3) | — | C |
| C-17 | Example 17 | R1 | 1000 | (P-2) | (W-2) | D |
| C-18 | Example 18 | R2 | 1000 | (P-1) | (W-1) | E |
| C-19 | Example 19 | R2/R3 | 900/100 | (P-2) | (W-2) | F |
| C-20 | Comparative Example 1 | R1/R4 | 1000/5 | (P-3) | — | G |
| C-21 | Comparative Example 2 | R2 | 1000 | (P-1) | (W-1) | H |
| C-22 | Comparative Example 3 | R1/R3 | 900/100 | (P-2) | (W-2) | G |
| C-23 | Comparative Example 4 | R1/R4 | 1000/5 | (P-3) | — | H |
| C-24 | Comparative Example 5 | R2 | 1000 | (P-1) | (W-1) | I |
| C-25 | Comparative Example 6 | R2 | 1000 | (P-1) | (W-1) | J |

| Curable composition | Number of times of Filtration 1 | Applied pressure 1 [MPa] | Filter 2 | Number of times of Filtration 2 | Applied pressure 2 [MPa] | Filtration 2 |
|---|---|---|---|---|---|---|
| C-1 | 1 | 0.20 | — | — | — | — |
| C-2 | 1 | 0.30 | — | — | — | — |
| C-3 | 1 | 0.10 | — | — | — | — |
| C-4 | 1 | 0.10 | — | — | — | — |
| C-5 | 1 | 0.50 | — | — | — | — |
| C-6 | 1 | 0.10 | — | — | — | — |
| C-7 | 1 | 0.20 | — | — | — | — |
| C-8 | 5 | 0.10 | — | — | — | — |
| C-9 | 3 | 0.30 | — | — | — | — |
| C-10 | 2 | 0.30 | — | — | — | — |
| C-11 | 3 | 0.30 | — | — | — | — |
| C-12 | 2 | 0.55 | — | — | — | — |
| C-13 | 3 | 0.30 | — | — | — | — |
| C-14 | 1 | 0.10 | C | 1 | — | Series-connected with Filtration 1 |
| C-15 | 1 | 0.30 | D | 1 | 0.30 | Filtration after Filtration 1 |
| C-16 | 2 | 0.30 | E | 2 | 0.30 | Filtration after Filtration 1 |
| C-17 | 1 | 0.30 | F | 2 | 0.30 | Filtration after Filtration 1 |
| C-18 | 1 | 0.30 | A | 2 | 0.30 | Filtration after Filtration 1 |
| C-19 | 2 | 0.30 | B | 1 | 0.30 | Filtration after Filtration 1 |
| C-20 | 1 | 0.30 | — | — | — | — |
| C-21 | 2 | 0.30 | — | — | — | — |
| C-22 | 1 | 0.30 | H | 1 | 0.30 | Filtration after Filtration 1 |
| C-23 | 1 | 0.30 | G | 1 | 0.30 | Filtration after Filtration 1 |
| C-24 | 1 | 0.30 | — | — | — | — |
| C-25 | 1 | 0.30 | — | — | — | — |

<Polymerization Initiator>
P-1: IRGACURE-379EG (manufactured by BASF)
P-2: 2,4,6-trimethyl benzoyl-ethoxyphenyl-phosphineoxide (manufactured by BASF:Lucirin TPO-L)
P-3: IRGACURE-OXE01 (manufactured by BASF)<Surfactant>
W-1: Fluorine series surfactant (manufactured by Tokem products: fluorine series surfactant)
W-2: Fluorine series surfactant (manufactured by DIC corporation:Megafac 31)<
<Evaluation of Patternability>
(Pattern Peeling-1)

Each of the curable compositions prepared in the above was spin-coated on a 8-inch-silicon substrate at a speed of 1500 rpm to form a coating film. A mold having a 40-nm-wide, 80-nm deep line/space (1/1) pattern formed thereon and having silane coupling agent (Optool HD1100, from Daikin Industries Ltd.) having a perfluoropolyether structure coated on the surface thereof for assisting mold releasing was placed on the film, the film was allowed to cure under irradiation of light of mercury lamp which contains 365-nm light at an illuminance of 10 mW/cm², and an exposure energy 200 mJ/cm², under nitrogen flow while being pressurized by the mold at 1 mPa, then the mold was slowly separated after the curing. The obtained pattern was observed under a scanning electron microscope. The peeling of the pattern was evaluated as follows. The results are shown in Table 3.

A: no pattern defect was observed
B: pattern defect was observed in less than 1% of area in which pattern was formed
C: pattern defect was observed in not less than 1% to less than 3% of area in which pattern was formed
D: pattern defect was observed in not less than 3% to less than 10% of area in which pattern was formed
E: pattern defect was observed in more than 10% of area in which pattern was formed

TABLE 3

| Number | Pattern peeability 1 |
|---|---|
| Example 1 | B |
| Example 2 | B |
| Example 3 | B |
| Example 4 | B |
| Example 5 | B |
| Example 6 | C |
| Example 7 | C |
| Example 8 | A |
| Example 9 | A |
| Example 10 | A |
| Example 11 | A |
| Example 12 | C |
| Example 13 | B |
| Example 14 | A |
| Example 15 | A |
| Example 16 | A |
| Example 17 | B |
| Example 18 | A |
| Example 19 | B |
| Comparative Example 1 | E |
| Comparative Example 2 | E |
| Comparative Example 3 | D |
| Comparative Example 4 | D |
| Comparative Example 5 | E |
| Comparative Example 6 | D |

(Pattern Peeling-2)
The pattern was formed as the same method as that in the above, except that the film was formed by ink-jet method. The obtained patterns each were evaluated according to the same method as that in the pattern peeling-1.
(Discharging-Failure)

The pattern peeling-2 was repeated 20 times sequentially. Discharging-failure due to clogging was confirmed. The discharging-failure means the phenomenon that the amount of discharging the composition from the nozzle tip per unit time reduces when compared with the amount of discharging the composition at the initial time.

The sample which did not cause the discharging-failure is shown as o, the sample which caused the discharging-failure is shown as x. The results are shown in Table 4.

TABLE 4

| Number | Pattern peeability 2 | Discharge failure |
|---|---|---|
| Example 1 | B | ○ |
| Example 2 | A | ○ |
| Example 3 | B | ○ |
| Example 4 | B | ○ |
| Example 5 | B | ○ |
| Example 6 | B | ○ |
| Example 7 | C | ○ |
| Example 8 | A | ○ |
| Example 9 | A | ○ |
| Example 10 | A | ○ |
| Example 11 | A | ○ |
| Example 12 | C | ○ |
| Example 13 | B | ○ |
| Example 14 | A | ○ |
| Example 15 | A | ○ |
| Example 16 | A | ○ |
| Example 17 | A | ○ |
| Example 18 | A | ○ |
| Example 19 | B | ○ |
| Comparative Example 1 | E | X |
| Comparative Example 2 | E | X |
| Comparative Example 3 | D | X |
| Comparative Example 4 | E | X |
| Comparative Example 5 | E | X |
| Comparative Example 6 | D | X |

<Evaluation of Stability Over Time>

The curable compositions (C-1) to (C-25) each were stored at each temperatures of 4° C., 23° C., 30° C. and 45° C. under condition of light shielding for 180 days, and then the number of particles in the composition was counted with the particle counter KS-41 manufactured by Rion. The number of increasing particles which is calculated according to the following formula was evaluated.

Number of increasing particles=(number of particles over time)−(number of particles at the initial time)

As the number of particles, density of particles having a size of 0.25 µm or more in 1 ml of the composition was measured. The result was shown in Table 5.

TABLE 5

| Number | 4° C. | 23° C. | 30° C. | 45° C. |
|---|---|---|---|---|
| Example 1 | 0 | 0 | 1 | 2 |
| Example 2 | 0 | 0 | 0 | 1 |

TABLE 5-continued

| Number | 4° C. | 23° C. | 30° C. | 45° C. |
|---|---|---|---|---|
| Example 3 | 0 | 0 | 0 | 1 |
| Example 4 | 0 | 0 | 0 | 2 |
| Example 5 | 0 | 0 | 0 | 1 |
| Example 6 | 0 | 0 | 1 | 2 |
| Example 7 | 1 | 1 | 2 | 5 |
| Example 8 | 0 | 0 | 0 | 0 |
| Example 9 | 0 | 0 | 0 | 0 |
| Example 10 | 0 | 0 | 0 | 0 |
| Example 11 | 0 | 0 | 0 | 0 |
| Example 12 | 0 | 0 | 0 | 0 |
| Example 13 | 0 | 0 | 0 | 0 |
| Example 14 | 0 | 0 | 0 | 0 |
| Example 15 | 0 | 0 | 0 | 1 |
| Example 16 | 0 | 0 | 0 | 1 |
| Example 17 | 0 | 0 | 1 | 3 |
| Example 18 | 0 | 0 | 1 | 1 |
| Example 19 | 0 | 0 | 0 | 0 |
| Comparative Example 1 | 10 | 46 | 67 | 215 |
| Comparative Example 2 | 6 | 27 | 46 | 162 |
| Comparative Example 3 | 8 | 30 | 51 | 180 |
| Comparative Example 4 | 7 | 31 | 55 | 137 |
| Comparative Example 5 | 9 | 41 | 74 | 159 |
| Comparative Example 6 | 8 | 26 | 55 | 166 |

As is clear from the tables, it was found that when the production method of the present invention is employed, the pattern-peeling at the time of peeling the mold is reduced. In addition, it was found that the method is excellent in the sequential ink-jet discharging and extremely suppresses forming particles over time.

The present disclosure relates to the subject matter contained in Japanese Patent Application 215795/2010 filed on Sep. 27, 2010, and Japanese Patent Application No. 180798/2011, filed on Aug. 22, 2011, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a curable composition for imprints, which comprises passing a curable composition comprising a polymerizable monomer (A) and a polymerization initiator (B) through a filter having an effective filter area of 200 cm$^2$ or more at least one time,
wherein:
the filtration is carried out at least twice;
the filter which the composition is passed through later has a smaller pore size than a pore size of the filter in the former filtration; and
the curable composition is substantially free from a solvent.

2. The method for producing a curable composition for imprints according to claim 1, wherein at least one filter has a pore size of 0.1 um or less.

3. The method for producing a curable composition for imprints according to claim 1, wherein all the filters each have a pore size of 0.1 um or less.

4. The method for producing a curable composition for imprints according to claim 1, wherein at least one filter is a fluorine resin filter or a polyethylene filter.

5. The method for producing a curable composition for imprints according to claim 1, wherein at least one filter is a filter cartridge in a pleat state fabricated from a membrane filter.

6. The method for producing a curable composition for imprints according to claim 1, wherein the polymerizable monomer (A) is a polymerizable monomer having an aromatic structure and/or a cyclic hydrocarbon structure.

7. The method for producing a curable composition for imprints according to claim 1, wherein the curable composition comprises a polymerizable monomer having at least one of fluorine atom and silicon atom.

8. The method for producing a curable composition for imprints according to claim 1, wherein the curable composition for imprints has a viscosity of 5 to 50 mPa·s at 25° C.

9. The method for producing a curable composition for imprints according to claim 1, wherein the curable composition for imprints comprises a surfactant.

10. A method for producing a curable composition for imprints, which comprises passing a curable composition comprising a polymerizable monomer (A) and a polymerization initiator (B) through a filter having an effective filter area of 200 cm$^2$ or more at least one time,
wherein:
the pressure applied to the composition at the filtration is 0.5 MPa or less; and
the curable composition is substantially free from a solvent.

* * * * *